US012614047B2

(12) United States Patent (10) Patent No.: US 12,614,047 B2
Pinto et al. (45) Date of Patent: Apr. 28, 2026

(54) REMOVABLE MEMORY CARD WITH EFFICIENT CARD LOCK MECHANISM, XY RATIOS, ANTI-REVERSE INSERTION FEATURE, PULLOUT FEATURE, AND PADS LAYOUT

(71) Applicant: Sandisk Technologies, Inc., Milpitas, CA (US)

(72) Inventors: Yoseph Pinto, Tel Aviv (IL); Jegathese Dhanachandra Prakash, Bangalore (IN); Nandha Kumar Mohanraj, Bangalore (IN); Satish Kammar, Bangalore (IN)

(73) Assignee: Sandisk Technologies, Inc., Milpitas, CA (US)

( * ) Notice: Subject to any disclaimer, the term of this patent is extended or adjusted under 35 U.S.C. 154(b) by 399 days.

(21) Appl. No.: 18/545,527

(22) Filed: Dec. 19, 2023

(65) Prior Publication Data

US 2025/0139395 A1 May 1, 2025

(30) Foreign Application Priority Data

Oct. 25, 2023 (IN) .............................. 202341072587

(51) Int. Cl.
*G06K 13/08* (2006.01)
*G06F 1/187* (2026.01)
*G06K 19/077* (2006.01)
*H05K 1/11* (2006.01)

(52) U.S. Cl.
CPC ......... *G06K 13/0856* (2013.01); *G06F 1/187* (2013.01); *G06K 19/07732* (2013.01); *H05K 1/117* (2013.01)

(58) Field of Classification Search
CPC .......... H05K 2201/10159; H05K 1/117; G06F 1/187; G06K 13/0856; G06K 19/07732
USPC ........................................ 361/679.31, 679.32
See application file for complete search history.

(56) References Cited

U.S. PATENT DOCUMENTS

| | | | | |
|---|---|---|---|---|
| 5,745,426 | A * | 4/1998 | Sekiyama ............... | H05K 1/117 365/63 |
| D523,435 | S | 6/2006 | Takiar et al. | |
| 7,306,161 | B2 | 12/2007 | Takiar et al. | |
| 7,336,498 | B2 | 2/2008 | Takiar et al. | |
| 7,416,132 | B2 | 8/2008 | Takiar et al. | |
| 8,754,534 | B2 * | 6/2014 | Shinohara ............... | G06F 1/185 438/109 |
| 9,377,825 | B2 * | 6/2016 | Shinohara ............... | G06F 1/185 |
| 10,037,784 | B2 * | 7/2018 | Han .................. | G06K 19/07743 |
| 10,380,055 | B2 * | 8/2019 | Han .................... | G06F 13/1668 |
| 10,403,329 | B2 * | 9/2019 | Han .................... | H01R 13/6683 |

(Continued)

OTHER PUBLICATIONS

D2 Non-final Office Action mailed Nov. 15, 2024 for U.S. Appl. No. 18/227,499.

(Continued)

*Primary Examiner* — Adrian S Wilson
(74) *Attorney, Agent, or Firm* — Crowell & Moring LLP

(57) ABSTRACT

A memory card is provided with various pad layouts to prevent a data signal pad from contacting a power contact in a host during insertion and removal of the memory card. The memory card can have a form factor and features that accommodate a relatively-large memory with relatively-high performance and accompanying thermal conditions. An efficient card lock mechanism is also provided.

20 Claims, 27 Drawing Sheets

* Any Signal or Ground Pads
** High-Speed Differential Interfaces of the I/O And/Or Other Signal Interfaces And/Or Ground Pads

(56) References Cited

U.S. PATENT DOCUMENTS

| | | | | |
|---|---|---|---|---|
| 10,530,077 | B2 * | 1/2020 | Khan | H01R 43/20 |
| 11,653,463 | B2 * | 5/2023 | Pinto | G06K 19/07743 |
| | | | | 361/679.32 |
| 12,277,465 | B2 * | 4/2025 | Pinto | G06K 19/07743 |
| 2004/0084538 | A1 * | 5/2004 | Nishizawa | G06K 19/07732 |
| | | | | 235/492 |
| 2005/0011671 | A1 | 1/2005 | Takiar et al. | |
| 2005/0148217 | A1 | 7/2005 | Takiar | |
| 2005/0281010 | A1 | 12/2005 | Wang et al. | |
| 2006/0053241 | A1 | 3/2006 | Lin et al. | |
| 2007/0207676 | A1 | 9/2007 | Ying et al. | |
| 2008/0016082 | A1 * | 1/2008 | Hsu | G06F 13/385 |
| 2009/0283885 | A1 | 11/2009 | Wada | |
| 2013/0242499 | A1 | 9/2013 | Kang et al. | |
| 2013/0260612 | A1 * | 10/2013 | Sherry | G06K 13/08 |
| | | | | 439/630 |
| 2014/0117097 | A1 | 5/2014 | Bosquet | |
| 2014/0347809 | A1 * | 11/2014 | Shinohara | G06F 1/185 |
| | | | | 361/679.32 |
| 2017/0148492 | A1 * | 5/2017 | Han | G11C 5/06 |
| 2017/0154003 | A1 | 6/2017 | Han et al. | |
| 2018/0088865 | A1 | 3/2018 | Lee | |
| 2018/0286466 | A1 * | 10/2018 | Han | G11C 5/14 |
| 2018/0366847 | A1 * | 12/2018 | Yu | H01R 13/11 |
| 2019/0044259 | A1 * | 2/2019 | Khan | H01R 43/20 |
| 2019/0182954 | A1 | 6/2019 | Sirajudeen et al. | |
| 2019/0341082 | A1 * | 11/2019 | Han | G11C 5/14 |
| 2020/0065643 | A1 | 2/2020 | Endo et al. | |
| 2020/0090020 | A1 | 3/2020 | Fujimoto et al. | |
| 2020/0413531 | A1 | 12/2020 | Wallash | |
| 2021/0368636 | A1 * | 11/2021 | Pinto | H05K 5/0247 |
| 2022/0053651 | A1 | 2/2022 | Park | |
| 2024/0334631 | A1 | 10/2024 | Fujimoto | |
| 2024/0428038 | A1 * | 12/2024 | Pinto | G06K 19/07732 |

OTHER PUBLICATIONS

U.S. Appl. No. 18/227,499, filed Jul. 28, 2023 entitled "Removable Memory Card with Efficient Card Lock Mechanism, XY Ratios, and Pads Layout."
U.S. Appl. No. 16/700,501, filed Dec. 2, 2019 entitled "Removable Memory Card with Efficient Card Lock Mechanism and Pads Layout."
SD Association; "Sd Express Delivers New Gigabyte Speeds for Sd Memory Cards"; retrieved from the Internet at https://www.sdcard.org/pdf/SDEXpressDeliversNewGigabtyeSpeedsForSDMemoryCards.pdf on Mar. 24, 2021; May 19, 2020; 3 pages.
Liu, Zhiye; "Toshiba Unveils XFMEXPRESS Form Factor for NVMe SSDs"; Sep. 6, 2019; Aug. 6, 2019; retrieved from the Internet at https://wwwtomshardware.com/news/toshiba-sfmexgress-nvme-ssd,40104.html on Mar. 24, 2021; 11 pages.
International Search Report completed Mar. 24, 2021 for International Application No. PCT/US2021/016882.
Written Opinion completed Mar. 24, 2021 for International Application No. PCT/US2021/016882.
Israel Patent Office Search Strategy completed Mar. 24, 2021 for International Anglication No. PCT/US2021/016882.
Non-final Office Action mailed May 7, 2024 for U.S. Appl. No. 18/227,499.
International Search Report mailed Oct. 14, 2024 for International Application No. PCT/US2024/034641.
Written Opinion mailed Oct. 14, 2024 for International Application No. PCT/US2024/034641.

* cited by examiner

FIG. 6
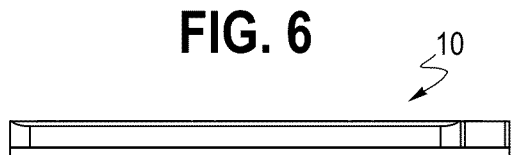
10
FIG. 4
FIG. 3
FIG. 5
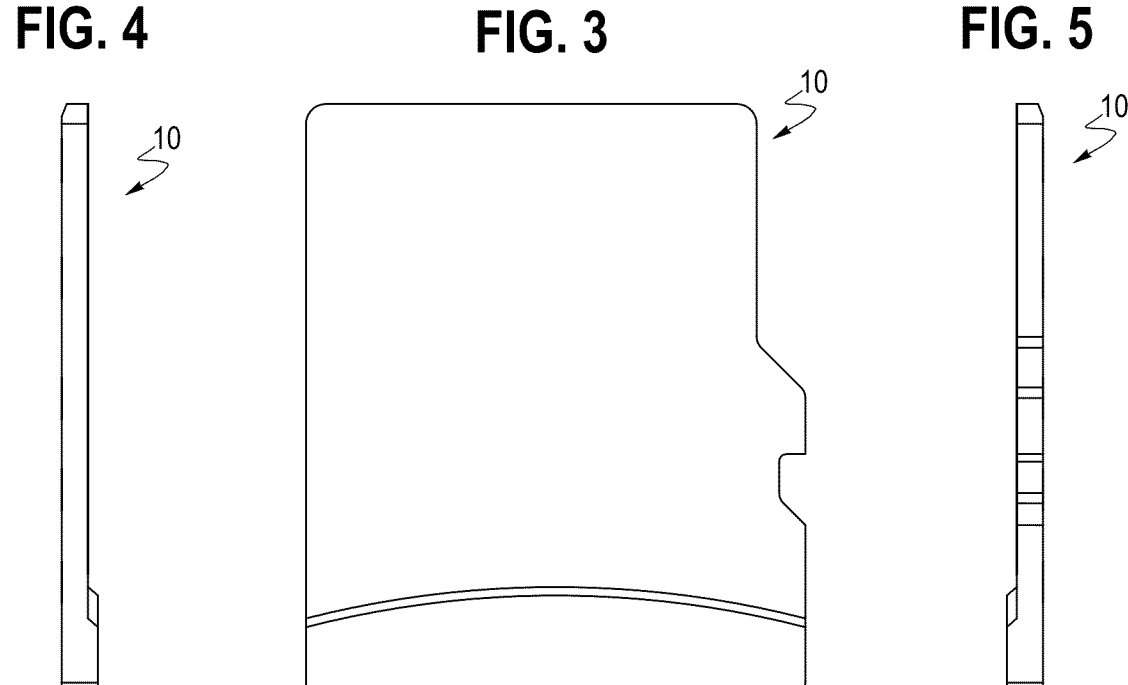
10
10
10
FIG. 7
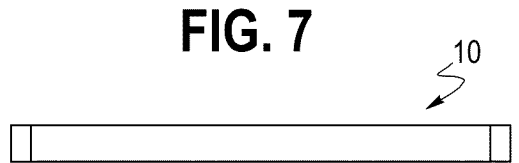
10

FIG. 11
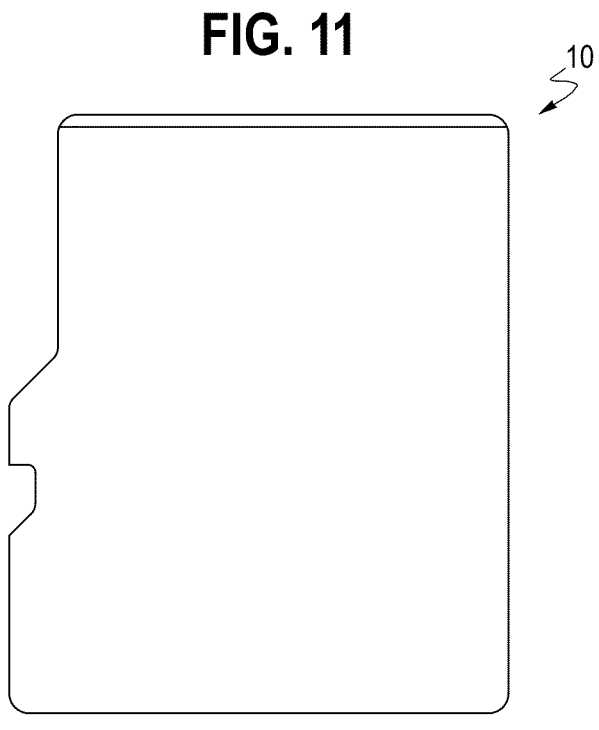
FIG. 12
FIG. 13
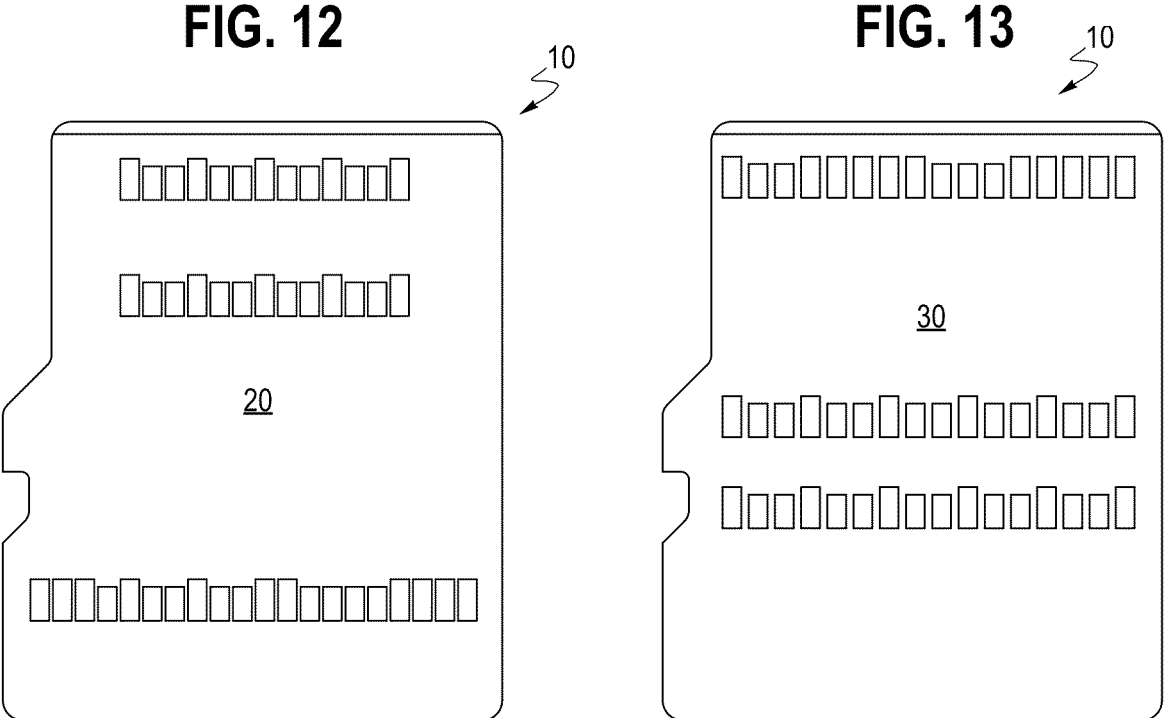

★ Any Signal or Ground Pads

★★ High-Speed Differential Interfaces of the I/O And/Or Other Signal Interfaces
    And/Or Ground Pads

10

| * | * | * | * | VDD2 | VDD2 | VDD2 | * | PRSNT# | * | * | * | VDD1 | VDD1 | VDD1 | * |

30

| ** | ** | ** | ** | ** | ** | ** | ** | ** | ** | ** | ** | ** | ** | ** | ** |

| ** | ** | ** | ** | ** | ** | ** | ** | ** | ** | ** | ** | ** | ** | ** | ** |

\* Any Signal, Power, or Ground Pads

\*\* High-Speed Differential Interfaces of the I/O And/Or Other Signal Interfaces And/Or Ground Pads

FIG. 23
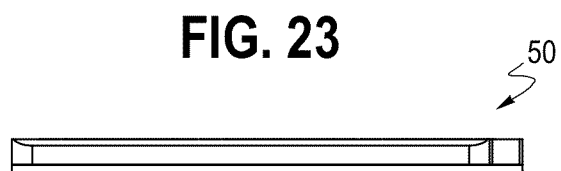
FIG. 21
FIG. 20
FIG. 22
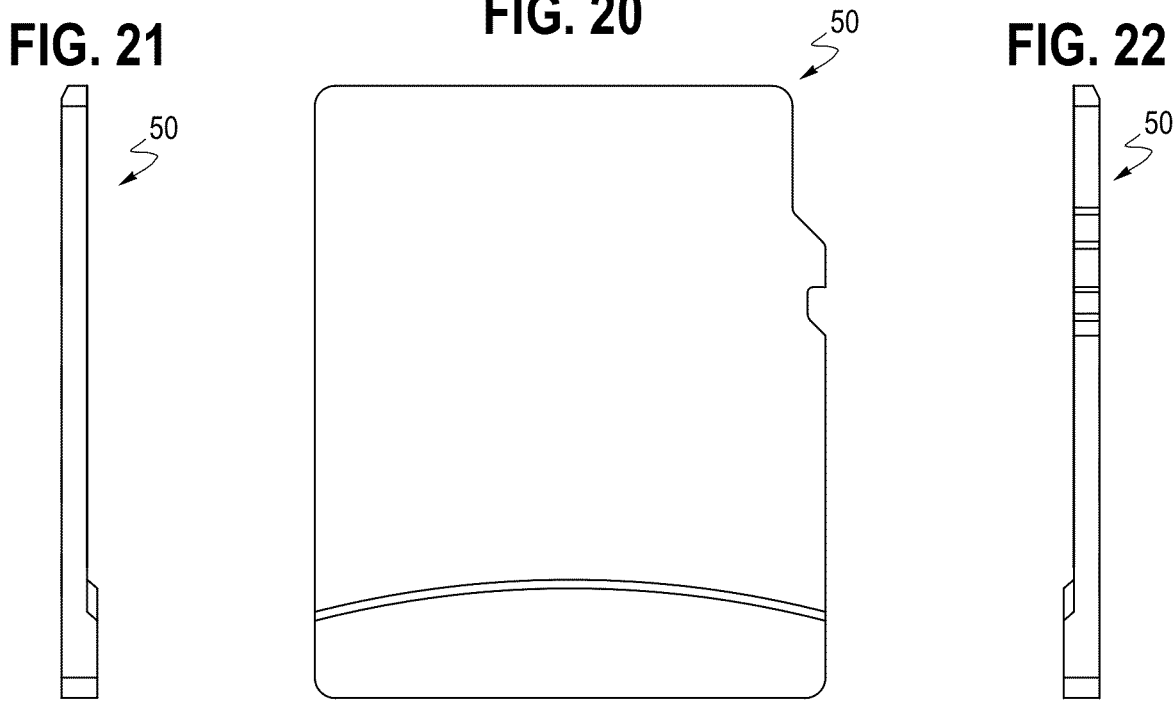
FIG. 24
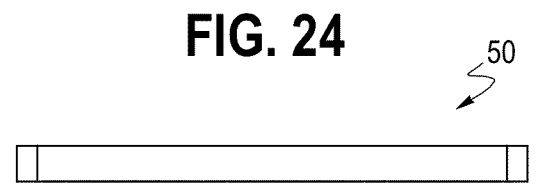

| * | * | * | * | VDD2 | VDD2 | VDD2 | * | PRSNT# | * | * | * | VDD1 | VDD1 | VDD1 | * |
|---|---|---|---|---|---|---|---|---|---|---|---|---|---|---|---|

| ** | ** | ** | ** | ** | ** | ** | ** | ** | ** | ** | ** | ** | ** | ** | ** |
|----|----|----|----|----|----|----|----|----|----|----|----|----|----|----|----|

| ** | ** | ** | ** | ** | ** | ** | ** | ** | ** | ** | ** | ** | ** | ** | ** |
|----|----|----|----|----|----|----|----|----|----|----|----|----|----|----|----|

\*   Any Signal, Power, or Ground Pads

\*\*   High-Speed Differential Interfaces of the I/O And/Or Other Signal Interfaces
And/Or Ground Pads \* Any Signal or Ground Pads \*\* High-Speed Differential Interfaces of the I/O And/Or Other Signal Interfaces
And/Or Ground Pads 24mm

30

50

20mm

15mm

55

11mm

50

80

52

38

38

50

80

94

90

92

300

300

FIG. 41
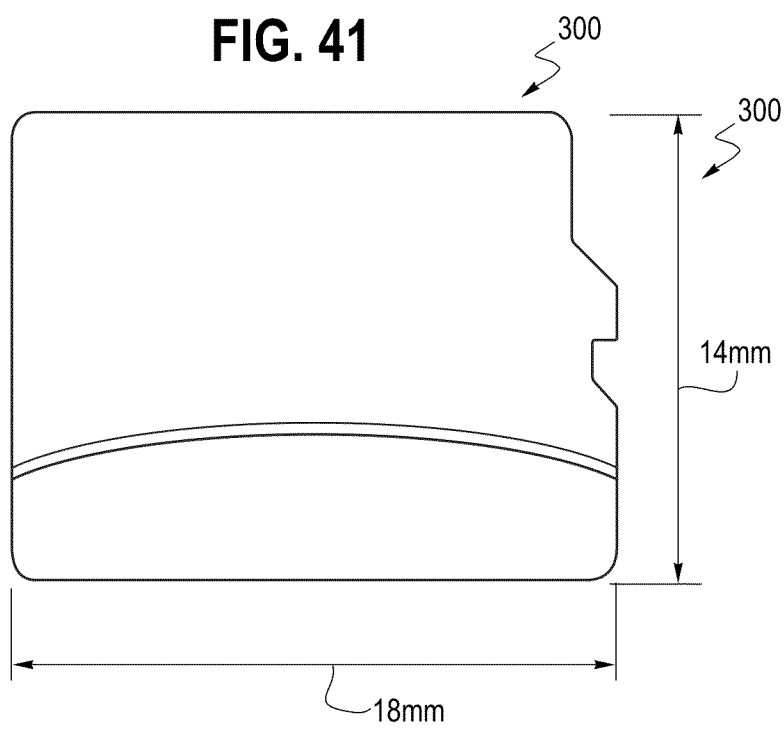
FIG. 42
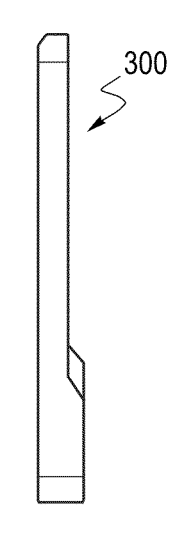
FIG. 44
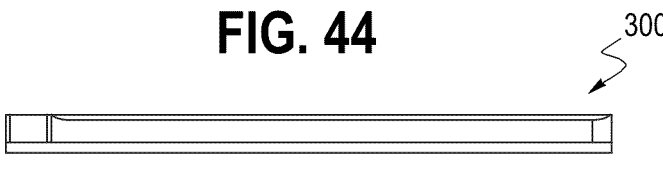
FIG. 45
FIG. 43
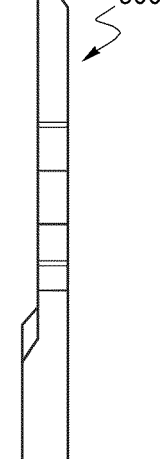

300

400

REMOVABLE MEMORY CARD WITH EFFICIENT CARD LOCK MECHANISM, XY RATIOS, ANTI-REVERSE INSERTION FEATURE, PULLOUT FEATURE, AND PADS LAYOUT

CROSS-REFERENCE TO RELATED APPLICATION

This application claims priority to Indian Provisional Patent Application No. 202341072587, filed Oct. 25, 2023, which is hereby incorporated by reference.

BACKGROUND

A host can use a memory card to read and write data. A host can be, for example, a mobile computing device, such as a phone, tablet, or laptop. A memory card can be, for example, a microSD™ card. Other types of hosts and memory cards can be used.

BRIEF DESCRIPTION OF THE DRAWINGS

FIG. 3 is a top view of the memory card shown in FIG. 1.

FIG. 4 is a left-side view of the memory card shown in FIG. 1.

FIG. 5 is a right-side view of the memory card shown in FIG. 1.

FIG. 6 is a front view of the memory card shown in FIG. 1.

FIG. 7 is a rear view of the memory card shown in FIG. 1.

FIG. 11 is a bottom view of the memory card shown in FIG. 1.

FIG. 12 shows the bottom view of the memory card shown in FIG. 11 with the first pad layout.

FIG. 13 shows the bottom view of the memory card shown in FIG. 11 with the second pad layout.

FIG. 20 is a top view of the memory card shown in FIG. 18.

FIG. 21 is a left-side view of the memory card shown in FIG. 18.

FIG. 22 is a right-side view of the memory card shown in FIG. 18.

FIG. 23 is a front view of the memory card shown in FIG. 18.

FIG. 24 is a rear view of the memory card shown in FIG. 18.

FIG. 31 shows the bottom view of the memory card shown in FIG. 30 with a more-detailed view of the first pad layout.

FIG. 41 is a top view of the memory card shown in FIG. 39.

FIG. 42 is a left-side view of the memory card shown in FIG. 39.

FIG. 43 is a right-side view of the memory card shown in FIG. 39.

FIG. 44 is a front view of the memory card shown in FIG. 39.

FIG. 45 is a rear view of the memory card shown in FIG. 39.

DETAILED DESCRIPTION

By way of overview, there is a need in mobile computing devices (e.g., phones, tablets, laptops, gaming, Internet of Things (IoT)) for a removable memory card that is easy to replace and upgrade or expand, has a low profile, has a relatively-large memory, and has relatively-high performance. Existing memory cards, such as microSD™ memory cards, have a form factor that is too small to handle the high performance demands and the thermal conditions that result from such high performance. The following embodiments provide memory cards with different form factors that can address the above issues.

Figure 1:
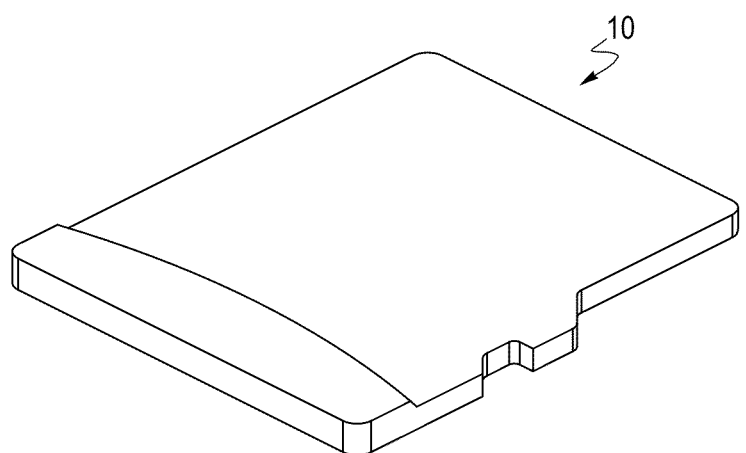
FIG. 1 is a rear, top perspective view of a memory card of an embodiment.
Figure 2:
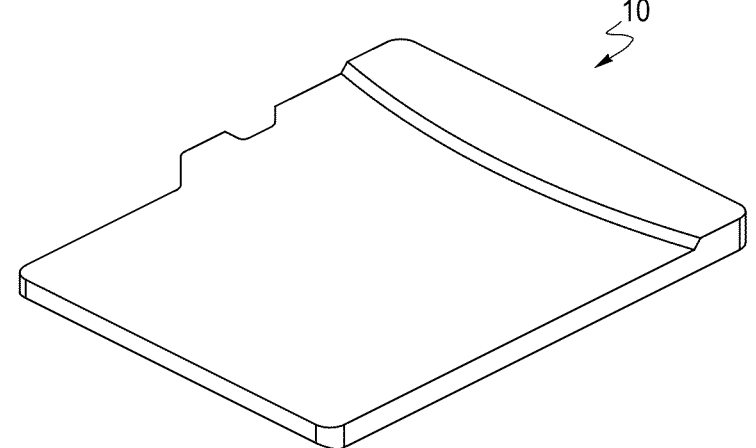
FIG. 2 is a front, top perspective view of the memory card shown in FIG. 1.
Figure 8:
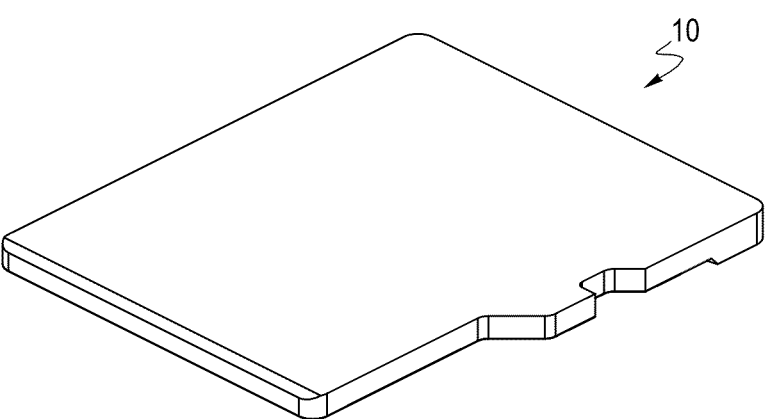
FIG. 8 is a front, bottom perspective view of the memory card shown in FIG. 1.
Figure 9:
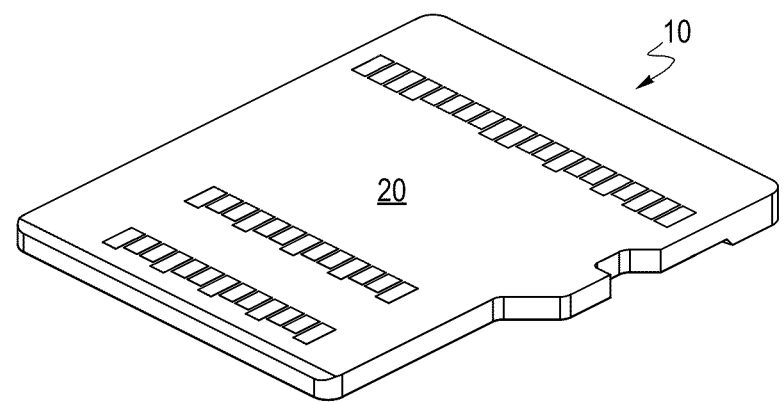
FIG. 9 shows the front, bottom perspective view of the memory card shown in FIG. 8 with a first pad layout.
Figure 10:
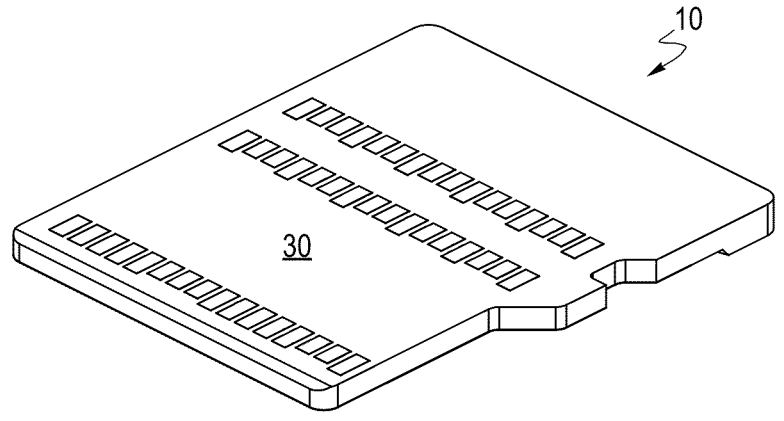
FIG. 10 shows the front, bottom perspective view of the memory card shown in FIG. 8 with a second pad layout.
Figure 14:
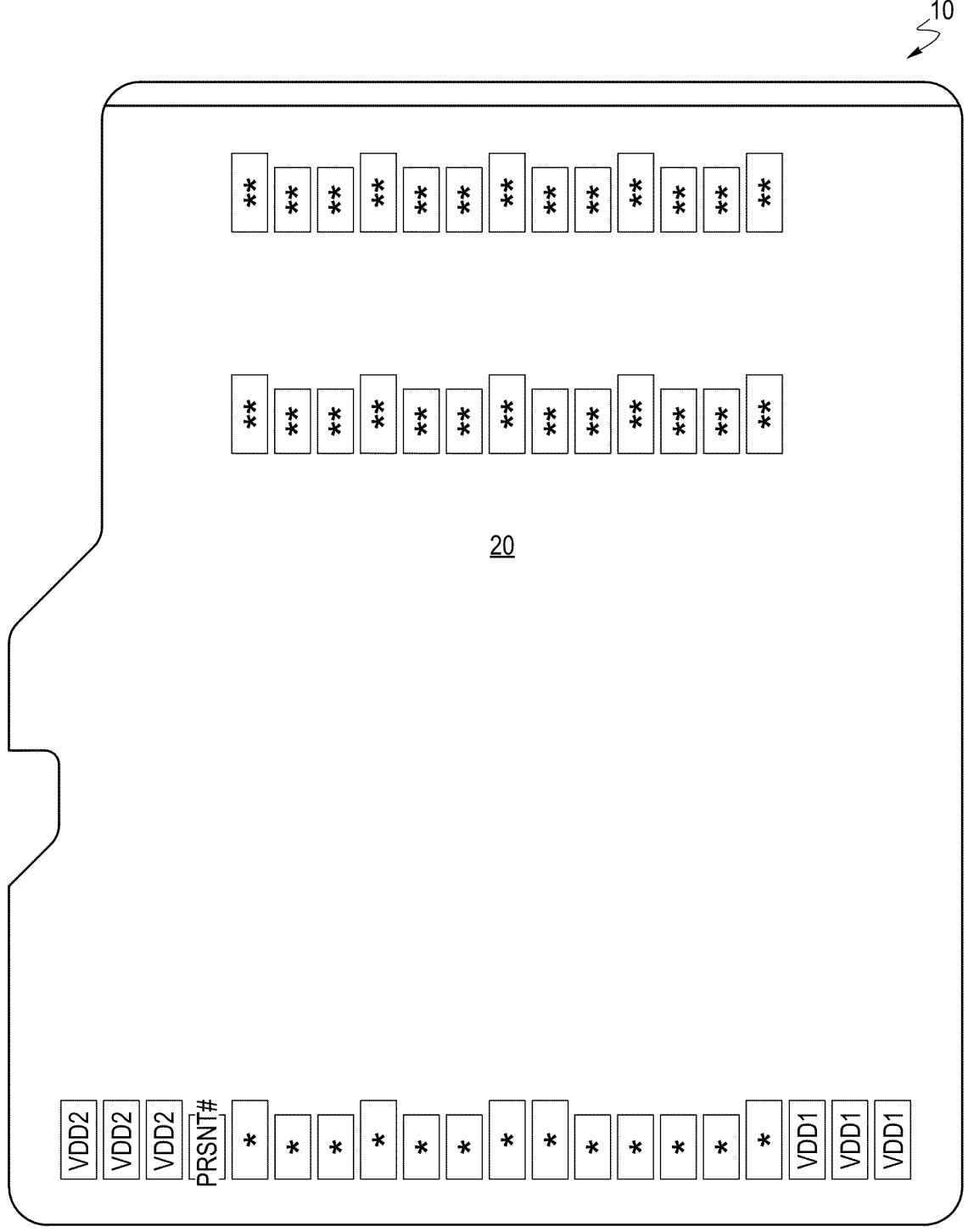
FIG. 14 shows the bottom view of the memory card shown in FIG. 12 with a more-detailed view of the first pad layout.
Figure 15:
FIG. 15 shows the bottom view of the memory card shown in FIG. 13 with a more-detailed view of the second pad layout.
Figure 16:
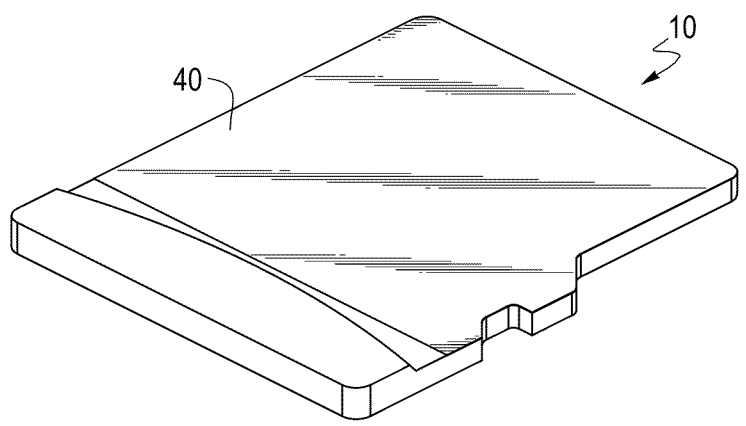
FIG. 16 is a rear, top perspective view of a memory card of another embodiment, in which the memory card has a metal plate.
Figure 17:
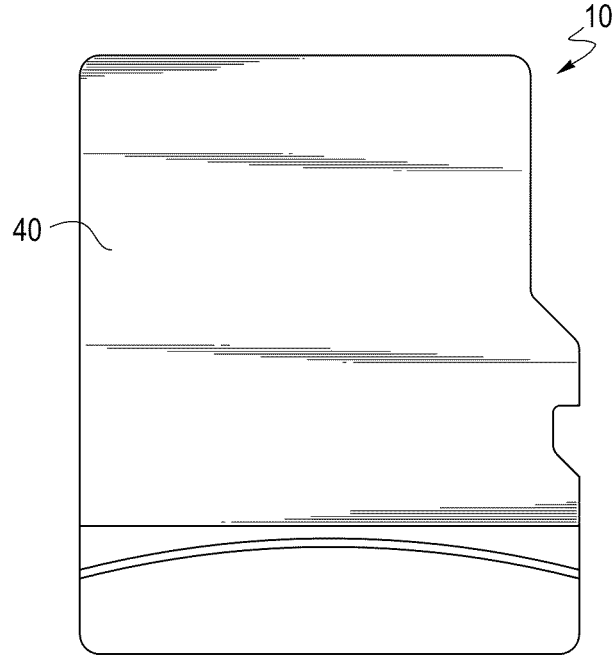
FIG. 17 is a top view of the memory card shown in FIG. 16.
Figure 18:
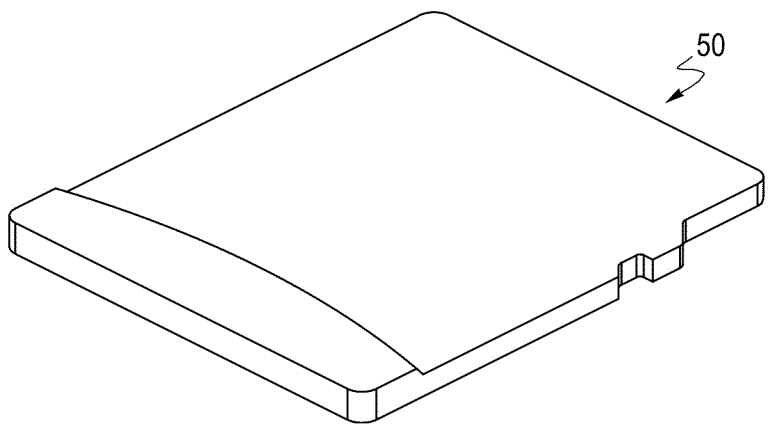
FIG. 18 is a rear, top perspective view of a memory card of another embodiment with different card locking support proportional size and placement.
Figure 19:
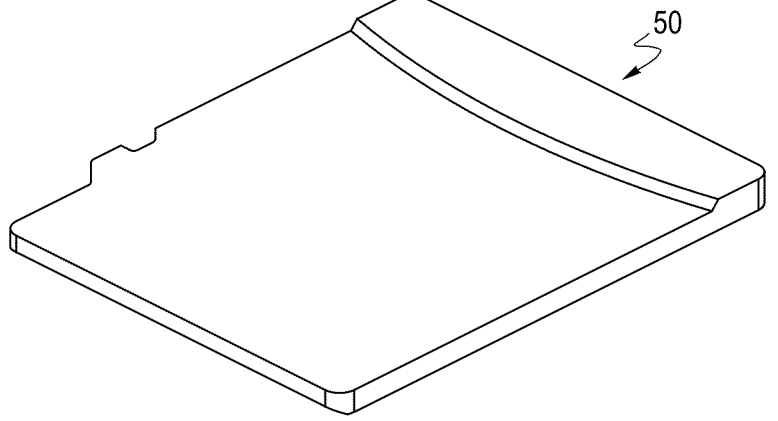
FIG. 19 is a front, top perspective view of the memory card shown in FIG. 18.
Figure 25:
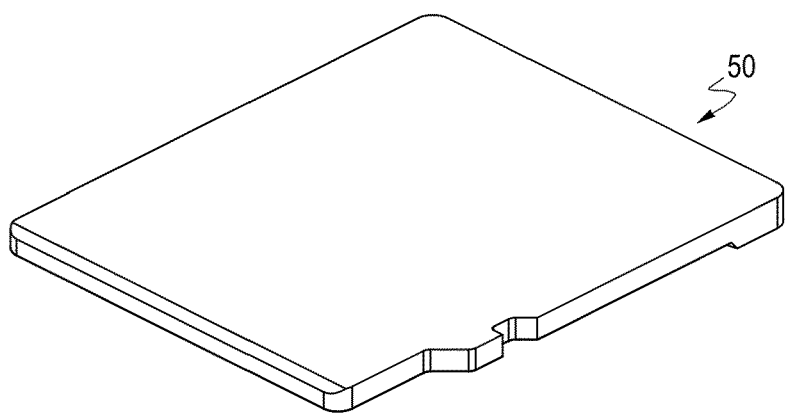
FIG. 25 is a front, bottom perspective view of the memory card shown in FIG. 18.

In one embodiment, a memory card is provided that has an overall shape similar to a microSD™ card but with larger dimensions and different pad layouts to support the memory, performance, and thermals capabilities noted above. FIGS. 1-8 and 11 show various views of one such memory card 10 of an embodiment to illustrate its form factor. Various pad layouts can be used on the bottom of the memory card. FIGS. 9, 12, and 14 illustrate one example pad layout, and FIGS. 10, 13, and 15 illustrate another example pad layout. To assist with heat dissipation as well as potential EMI protection, a metal plate 40 can be used on the top of the memory card 10, and FIGS. 16 and 17 illustrate one example of this.

The pads can be used to connect with corresponding electrical connectors in a host to place the host in communication with the memory card 10. The memory card 10 can comprise any suitable memory (including a three-dimensional memory), and a controller that can be configured to read data from and store data in the memory. The controller can implement other functions, such as error correction and storage algorithms.

There are several basic assumptions for the two pad layouts of these embodiments:

Support four peripheral component interconnect express (PCIe) lanes with up to two power supplies (e.g., 3.3 v/1.8 v or 2.7 v/1.2 v)

Separate the PCIe high speed I/Os from the rest and group them per PCIe lane

Provide GND isolations where needed

Allow balancing of the differential interfaces with PWR/GND

Have a separate pads row for the power, clock, and sideband signals

Avoid any conflicts of signal pads touching power pads during hot insertion/removal Spread of the three rows allows better heat dissipation from the card to the printed circuit board and easier connector design allowing dense pads with enough strength.

Includes PRSNT #(Present Detect) functional pad for card insertion/removal detection (without need for a card-detect switch)

Include two pads for CardType, which allow the hardware host to detect card type after card insertion is detected. This may provide advance information about the card's type if needed Include a few reserved pads for the future (i.e., Power Line Notification-PLN).

In both of the pad layouts 20, 30 mentioned above, there are three rows of pads. One row includes power supplies, clocks, and side band signals, and other rows include as many differential high-speed interfaces as needed. These pads support a high-speed differential interface based on the PCIe interface standard. The pads are powered with at least one power supply along with a few side band signals. The pads are arranged in a way that signal pads will never touch any power pads of the host side during card insertion or removal, thereby avoiding any conflicts in case of hot plug-in/out (i.e., insertion or removal of the card while the host is providing power to the card). A few pads are allocated for Card Type indication, allowing the host to detect through its hardware the type of an inserted card and/or its characteristics. A Present Detect pad is used to detect card insertion/removal, eliminating the need for a card detect switch commonly used in microSD™ cards. In this embodiment, the pads are arranged in a way that the Present Detect contact of the connector side will never touch any other signal pads, power, or ground during card insertion or removal, thereby avoiding any false card detection.

As mentioned above, the multiple-row pad layouts 20, 30 of these embodiments address the possible conflicts of signal shorts during hot plug-in/out. Due to the small cards dimension and the need to support multiple PCIe lanes, a large number of pads may be required to be placed in a relative-small area. Therefore, three rows of pads may be required to be placed one after the other. Hot plug-in/out can be supported as consumers may remove a card without any notification. That is, power might be supplied to the power contacts of the connector during card insertion or removal, and it is desired that no harm will be caused either to the card or to host if any signal or ground pad might touch any of the power contacts during the card's insertion/removal path. The same potential problem might happen if the host's present-detect contact touches any signal, power, or ground during the path of card insertion/removal. Such unintentional touch might cause a false card detect to the host, which is something that is desired to be avoided. Also, the host may like to get information about the card's type or specific characteristics or configuration using its hardware circuitry and without the need to initialize the card and read its internal information. Such need may be required for hardware-related support needs that are expected to be provided before any card operation is happening (i.e., supply of specific power voltage level or allowance of specific max current consumption during initialization time, etc.). A method to allow such information to be provided to the host and without being false detected due to hot plugin/out path conflicts can be provided.

As between the first and second pad layouts of these embodiments, in the first pad layout 20, the power rails are at the back of the card 10, closer to the thicker area of the card 10 (that may include the internal power circuits). This requires an open path between front pad rows eliminating contacting the front rows pads with power contacts during hot card insertion or removal. In the second pad layout 30, the power/control line is at the front, so connector's contacts of other rows never touch it. This allows a greater distance between the pads, which provides more flexibility.

In one embodiment, the following pad dimensions are used. Of course, this is just one example, and other dimensions can be used.

Pad width of about 0.75 mm and a distance between the centers of pads of about 1.05 mm (the distance between pads is about 0.3 mm).

The length of the short pad is about 1.35 mm, and the length of the long pad is about 1.65 mm.

The distance between differential high speed signal rows can be about 2 mm.

As mentioned above, the advantage of these simplified pad layouts 20, 30 is that they avoid any potential electrical conflicts or false card detection indication that might be caused by touch of any card pads with power contacts on the connector side or present detect (PRSNT #) contact during hot card insertion/removal.

Prior cards do not address the above issues adequately. For example, edge card connectors (such as the ones used on mother boards) have a very large profile and are less preferable in small, thin equipment like mobile devices. Also, hinge-type connectors (such as old "under battery" SIM cards or XFMexpress cards) do not have the problem of card pads sliding under other connector contacts during card insertion/removal. However, such connectors have a quite-high profile due to their mechanical strength and are not well suited for external removable card usages. Other solutions allows such contacts to happen (as in SD UHSII cards and SD Express cards) with special care considerations required to assure that no harm will happen. Such considerations limit the continuous evolution of the card's functionality and might put the card under risk if card/host manufacturers do not meet the restricted protection rules.

Also, the card type pads allow a hardware indication to the host about various card types/configurations right after card insertion detection. Further, today such information is provided usually through physical cuts on the board (i.e., in M.2 cards). Such solution requires different printed circuit boards for each card type as well as a configurable connector. It also does not allow electrical indication of specific configuration (programmed through software on the card or in the field). Other solutions provide the information at the same time as card insertion. In such cases, those card type pads need to also be protected against conflicts during card insertion/removal and require a dedicated path. While in the given solution, the card type pads are expected to be read by the host only after card detection was indicated to the host. Such solution allows no need to protect the path of those pads/contacts during card insertion/removal and allows the card, after it is inserted, to provide a logical value that corresponds to card's type/configuration.

In summary, the memory cards 10 of these embodiments address several issues and provide several advantages. For example, the pad layout 20, 30 of these embodiments avoid any potential electrical conflicts or false card detection indication that might be caused by touch of any pads touching power contacts on the connector side or card present detect (PRSNT #) contact during hot insertion/removal. That is achieved either by placing all the power pads and present-detect pad in the front row or keeping a clear path for those specific pads if they are placed in the second or third rows. Also, card-type pads allow a hardware indication to the host about various card types/configurations right after card insertion is detected. A few card pads are dedicated for that, and they are active only after the card 10 was inserted as well as sensed by the host only after card insertion was detected.

Figure 26:
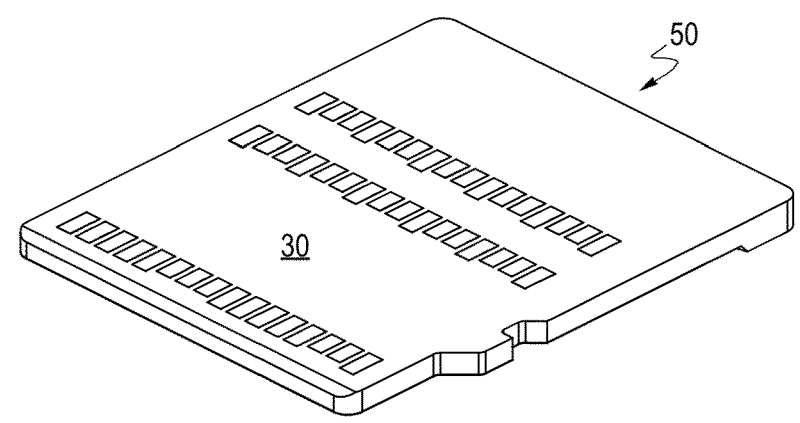
FIG. 26 shows the front, bottom perspective view of the memory card shown in FIG. 25 with a first pad layout.
Figure 27:
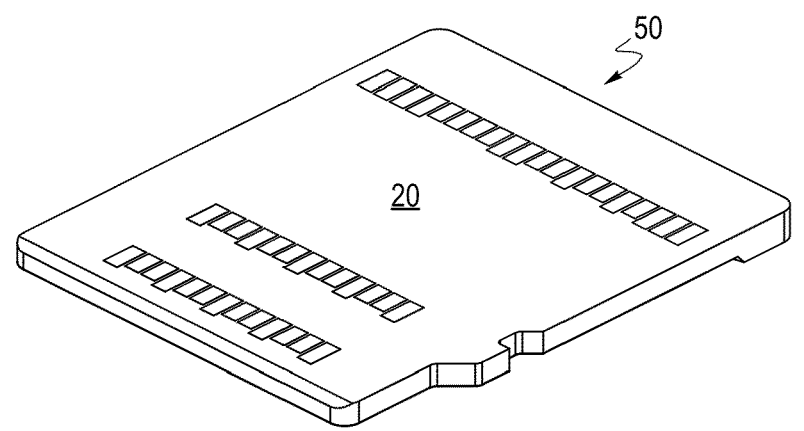
FIG. 27 shows the front, bottom perspective view of the memory card shown in FIG. 25 with a second pad layout.
Figures 28, 29, 30:
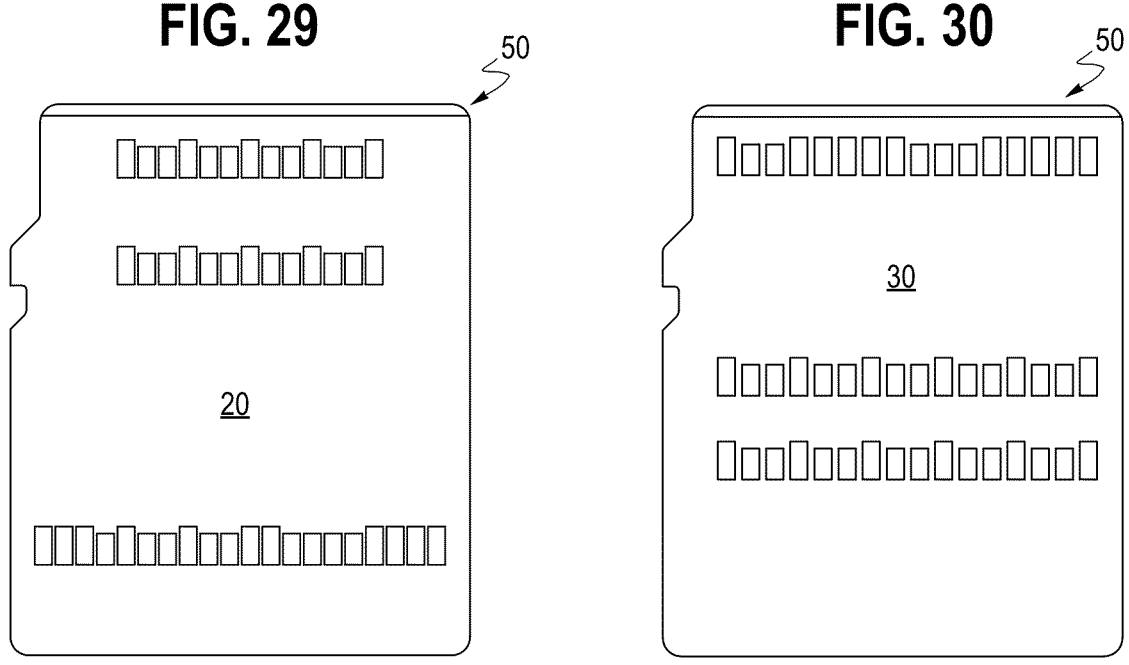
FIG. 28 is a bottom view of the memory card shown in FIG. 18.
FIG. 29 shows the bottom view of the memory card shown in FIG. 27 with the second pad layout.
FIG. 30 shows the bottom view of the memory card shown in FIG. 26 with the first pad layout.
Figure 32:
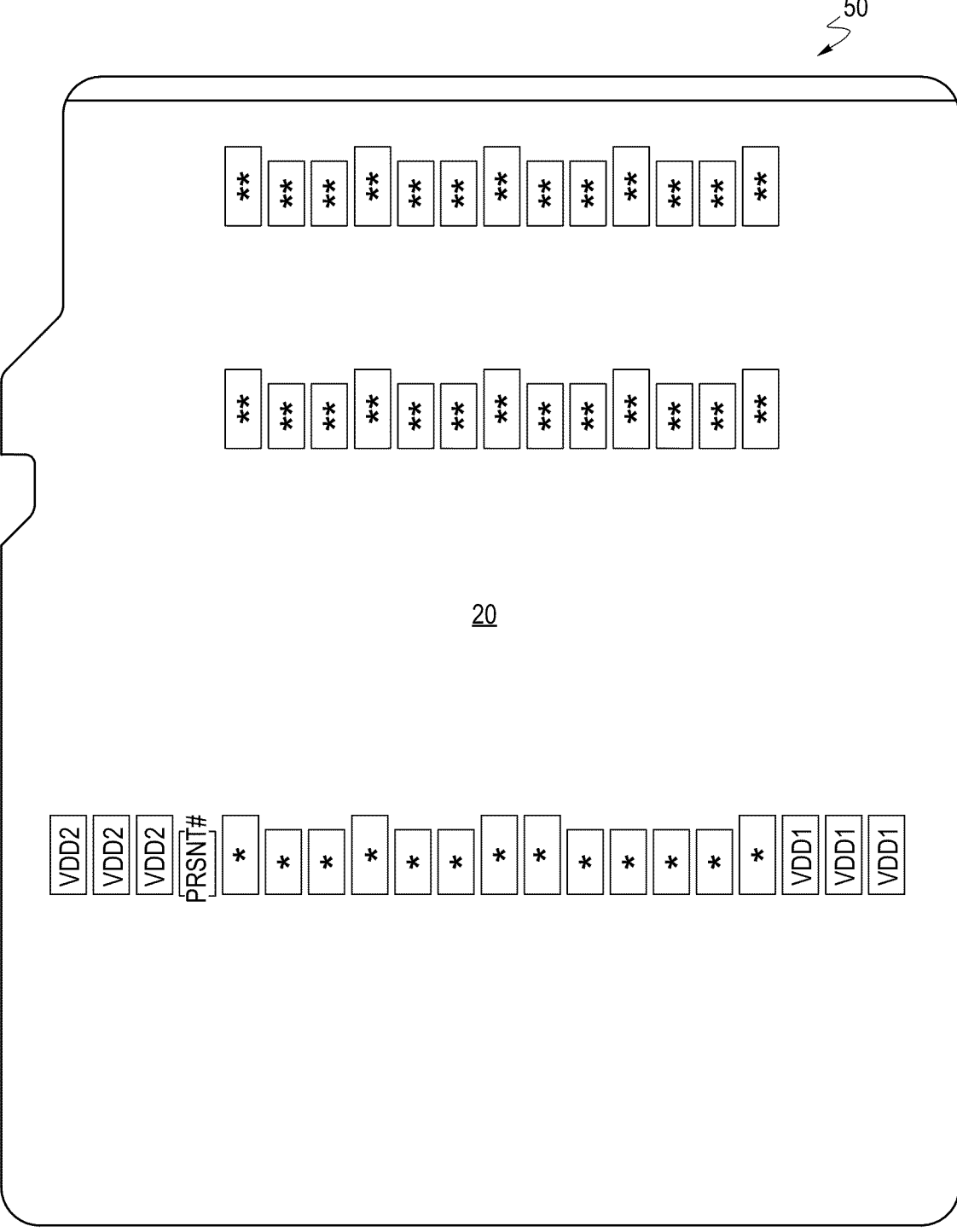
FIG. 32 shows the bottom view of the memory card shown in FIG. 29 with a more-detailed view of the second pad layout.
Figure 35:
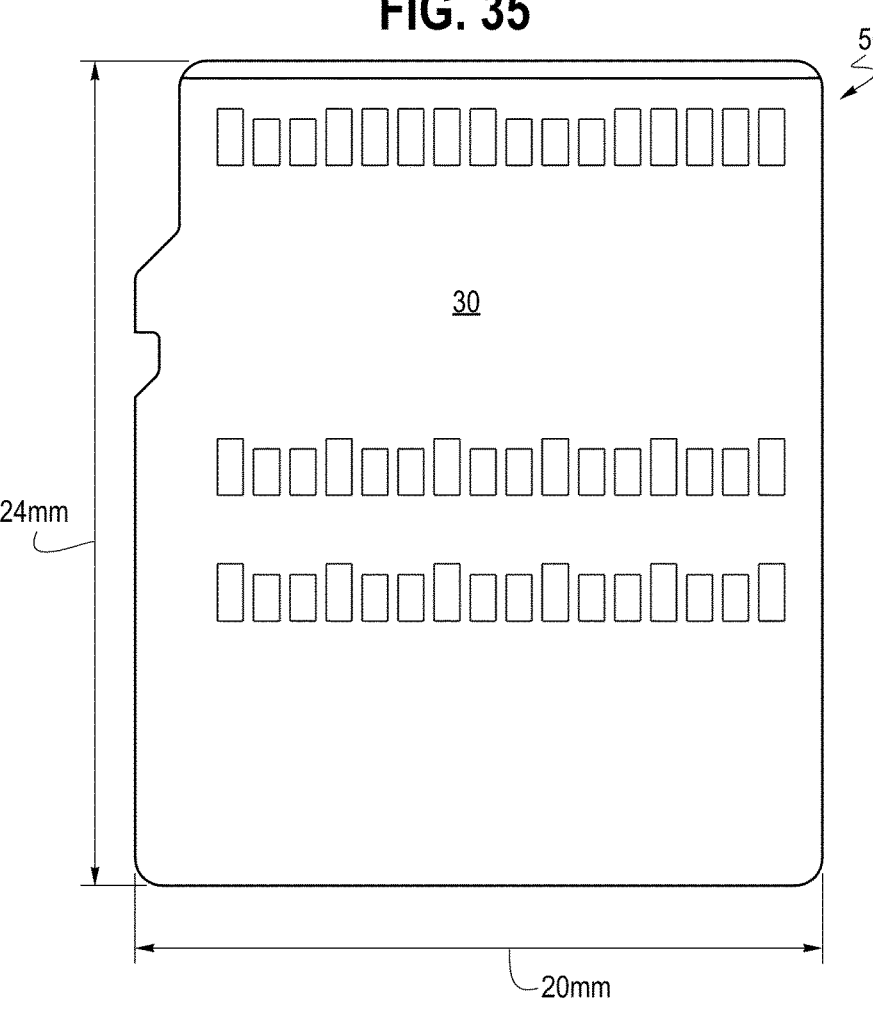
FIG. 35 shows the bottom view of the memory card shown in FIG. 30 with sample dimensions.
Figure 36:
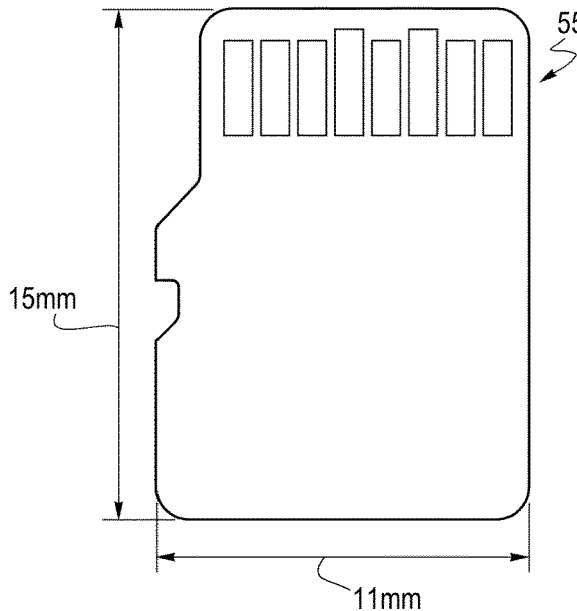
FIG. 36 shows a bottom view of a microSD™ memory card with sample dimensions.

In another embodiment, a memory card with a different form factor is used. FIGS. 18-25 and 28 show various views of one such memory card 50 of an embodiment to illustrate its form factor. FIG. 35 shows sample dimensions of one implementation of the memory card 50, and FIG. 36 shows the dimensions of a standard microSD™ card 55 for comparison. Various pad layouts can be used on the bottom of the memory card. FIGS. 26, 30, and 31 illustrate one example pad layout 30, and FIGS. 27, 29, and 32 illustrate another example pad layout 20.

While the pad layouts 20, 30 provided above have three rows, pad layouts including different number of rows (e.g., to support different number of differential interfaces) can also be used.

While the pad layouts 20, 30 provided above have all side band signals and power pads in separate row from differential signals, some of the pads can be placed in other rows as well.

Figures 33, 34:
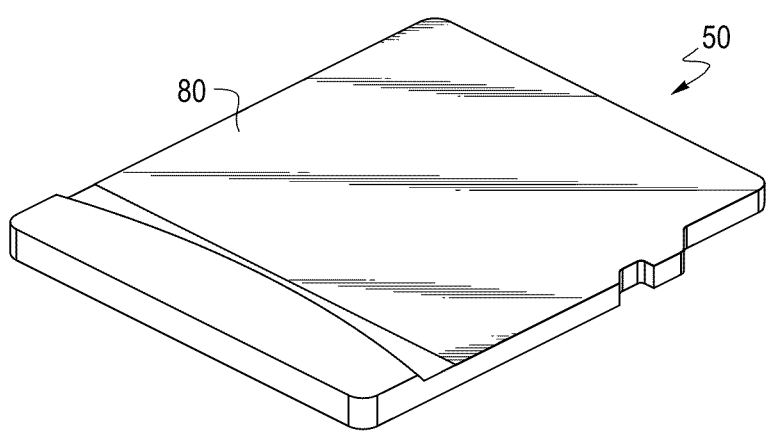
FIG. 33 is a rear, top perspective view of a memory card of another embodiment, in which the memory card has a metal plate.
FIG. 34 is a top view of the memory card shown in FIG. 33.
Figures 37, 38:
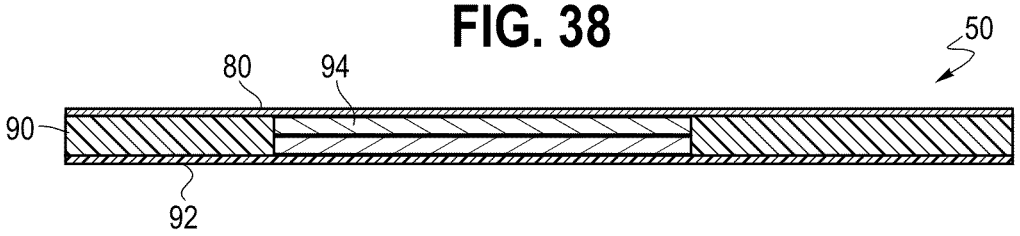
FIG. 37 is a top view of the memory card shown in FIG. 33.
FIG. 38 is a cross-sectional view of the memory card shown in FIG. 37.
Figure 39:
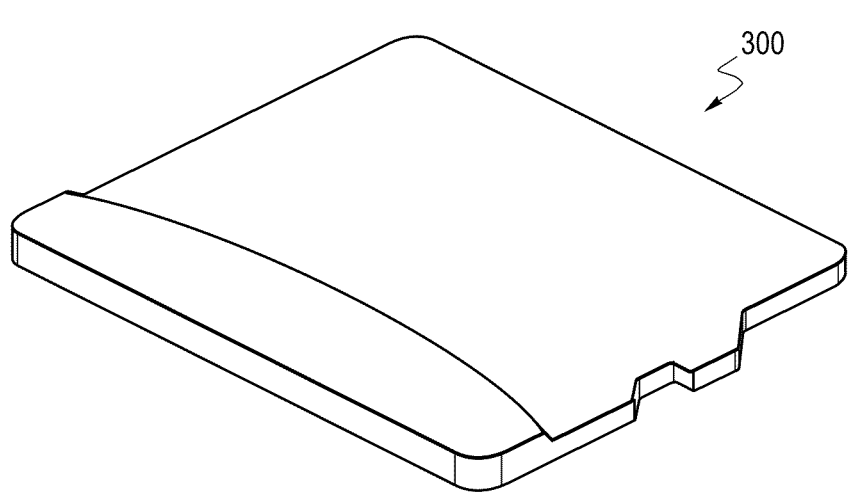
FIG. 39 is a rear, top perspective view of a memory card of an embodiment.

To assist with heat dissipation, a metal plate 80 can be used on the top of the memory card 50, and FIGS. 33 and 34 illustrate one example of this. FIGS. 37 and 38 show the metal plate 80 and a cross-sectional view, respectively. This optional metal plate 80 not only provides better thermal conducting, it also provides better protection against electromagnetic interference (EMI) in case the connector is not enough. As shown in the cross-sectional view, the memory card 50 has molded plastic 90, a substrate 92 (upon which the metal plate 80 may stand), and internal components 94.

As can be seen by comparing the form factors of the memory cards 10, 50 of these two embodiments, the card lock mechanism 52 of the memory card 50 of the second embodiment has the shape and size of microSD™ card while the actual card dimension is bigger than microSD™ card.

In general, these embodiments solve the problem of the increased size form factor and the need for a new card lock mechanism. The removable memory card 10, 50 of these embodiments is in a size larger than a typical microSD™ card, which allows higher capacity and better thermal characteristics using higher speeds. A card lock mechanism is desirable to allow better lock of the card in mobile and/or other shaking devices. Regardless of the need for card's shape that allows efficient card lock, the card's area is maximized to allow maximum memory dies as well as large number of pads with enough room for producible supporting connectors.

Also, the asymmetrical front edge of the memory card protect against reverse insertion, the far edge of the memory card allows easy pulling of the card using a finger nail, a partial thin plane is useful in serving low-profile applications, and the partial thicker edge can accommodate internal thicker components.

Providing a new card lock mechanism or simply increasing the whole microSD™ size in the same proportions (including its locking mechanism) are both possible. If the card is designed by simply increasing dimensions but otherwise using the same ratio of a standard microSD™ card (as in the first embodiment above), the front, narrow part of the card consumes a large part of the card, and there is a quite large non-used area at the front half that limits the memory dies, as well as number of pads in a row or prevents pads with enough room to allow easy connector design. The solution for that would be a further increase of the card's total dimensions. Another method would be to have a wider area in the front but with a new small efficient lock mechanism 55, as shown in the second embodiment. However, usage of the same size and shape of the existing microSD™ locking mechanism while increasing the total size of the card allows utilization of the existing mechanical locking mechanism used in legacy connectors for more than 15 years and can increase confidence and reduce costs. But by keeping the original locking mechanism size while increasing the total card size, the front end of the card is much bigger, which means more card area, more memory, better thermal capabilities, and more area for more pads. It should be noted that, in this embodiment, the ratio of the size between the locking shape and the overall card size is different than microSD™. Only the locking mechanism has the same shape and size.

Returning again to the drawings, FIGS. 39-46 are rear, top perspective; front, bottom perspective; top; left-side; right-side; front view; rear; and bottom views, respectively, of a memory card 300 of another embodiment. As shown in these drawings, the memory card 300 of this embodiment has a width (i.e., the back edge in the direction of insertion) that is wider than its length, and is shorter and wider than the memory cards discussed above. Despite this difference in length and width, the notch on the side of the memory card 300 can have the same shape and size as conventional microSD™ cards.

In one example implantation (see FIG. 41), the form factor of the memory card 300 is about 14 mm×18 mm. In one embodiment, the thickness of the memory card 300 is between (a) about 1.0+/−0.1 mm on its thinner edge and 1.4+−0.1 mm on its thicker edge and (b) about 1.4+/−0.1 on its thinner edge and 2+/−0.1 mm on its thicker edge. It should be noted that other dimensions can be used, and these dimensions should not be read into the claims unless expressly recited therein. For example, in another embodiment, the memory card has the dimensions of about 18 mm×16 mm, with a thickness of about 1 mm on its thinner edge and about 1.4 mm on its thicker edge).

Figure 40:
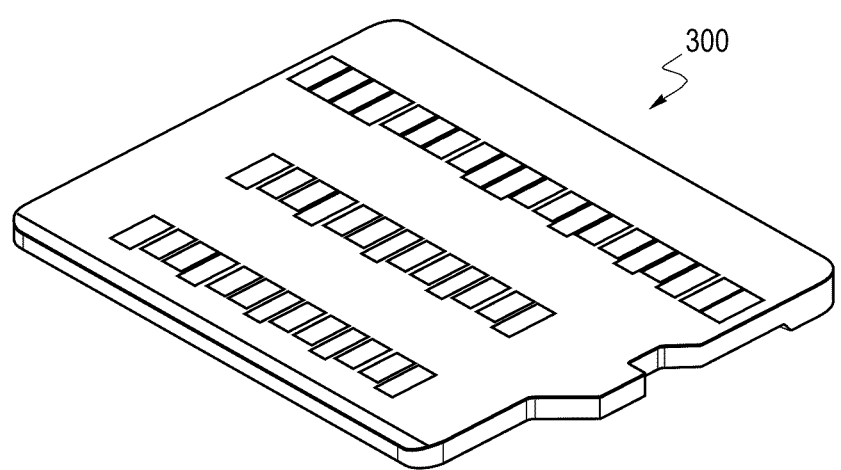
FIG. 40 is a front, bottom perspective view of the memory card shown in FIG. 39.
Figures 46, 47:
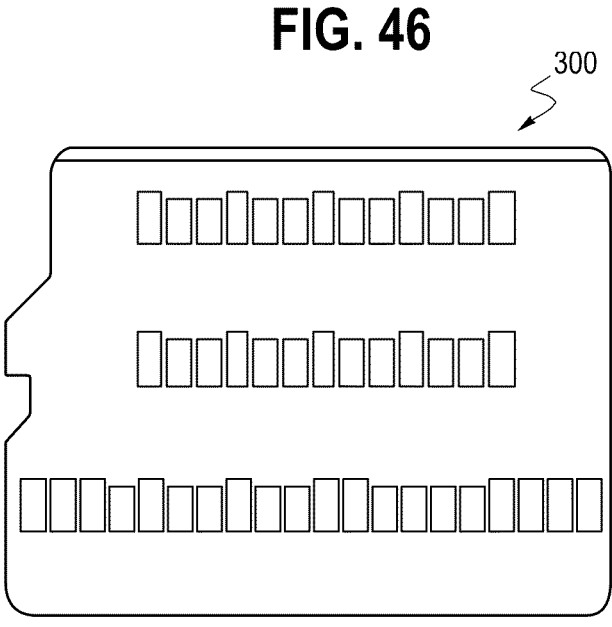
FIG. 46 is a bottom view of the memory card shown in FIG. 39.
FIG. 47 is a bottom view of a memory card of another embodiment.

FIGS. 40 and 46 illustrate the pad layout on the bottom of the memory card 300 of this embodiment. In one example implementation, the length of the longer pad is about 1.6 mm or 1.65 mm, the length of the shorter pad is about 1.35 mm, the pad width is about 0.70 mm, 0.71 mm, or 0.72 mm, and the distance between the pads is about 0.15 mm. Again, these dimensions are merely examples.

Figure 48:
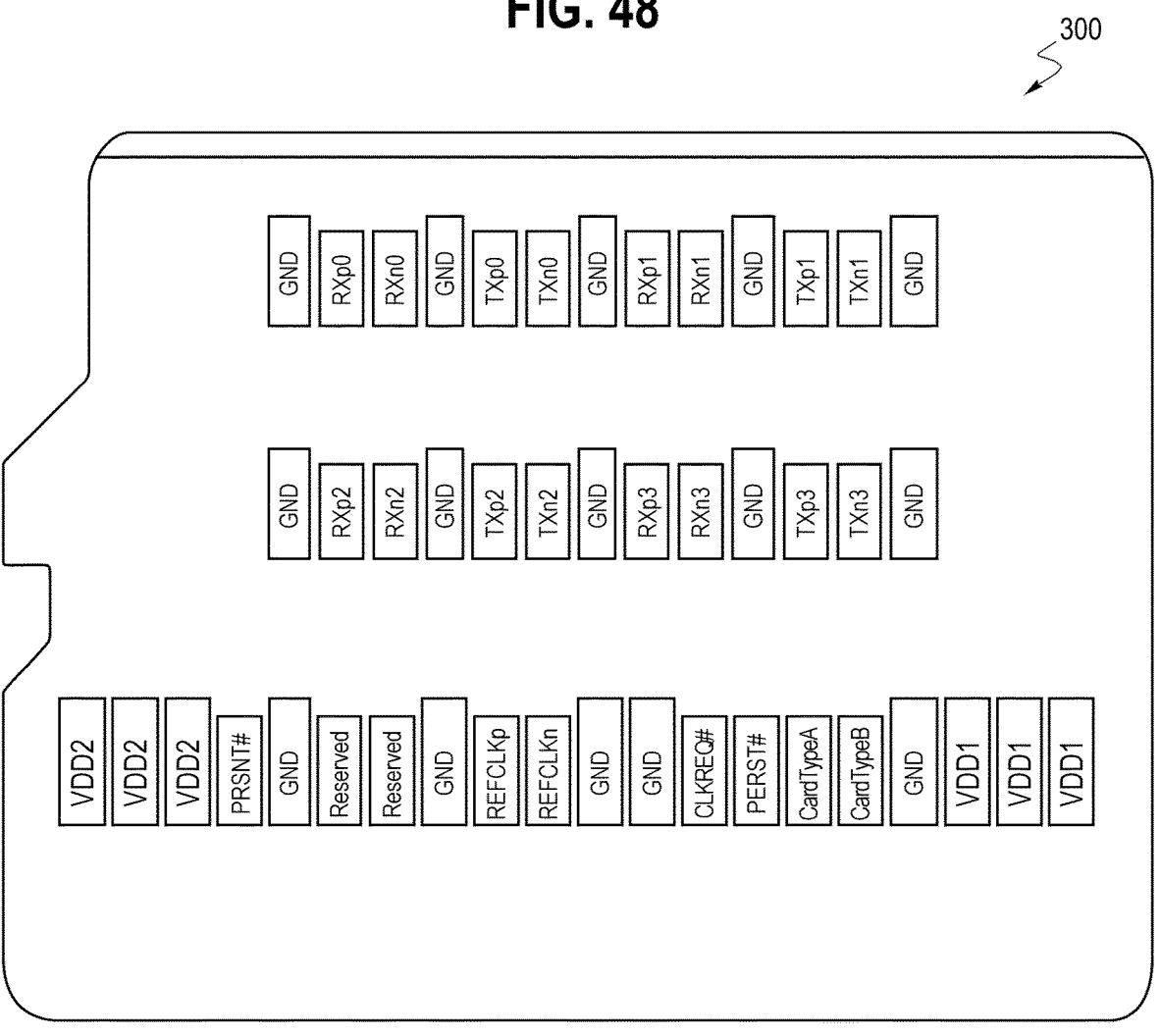
FIG. 48 is a detailed illustration of the bottom view of FIG. 46.

FIG. 48 is a detailed illustration of the function of each of these pads in an example embodiment. As shown in FIG. 48, the power pads (the three VDD1 pads and the three VDD2 pads) are on either side of the back row, and there are no pads forward (in the direction of card insertion) of the power pads. As such, the signal pads of the memory card 300 will never touch any power pads of a host during card insertion or removal, thereby avoiding any conflicts in case of hot plug-in/out (i.e., insertion or removal of the card 300 while the host is providing power to the card).

Figure 49:
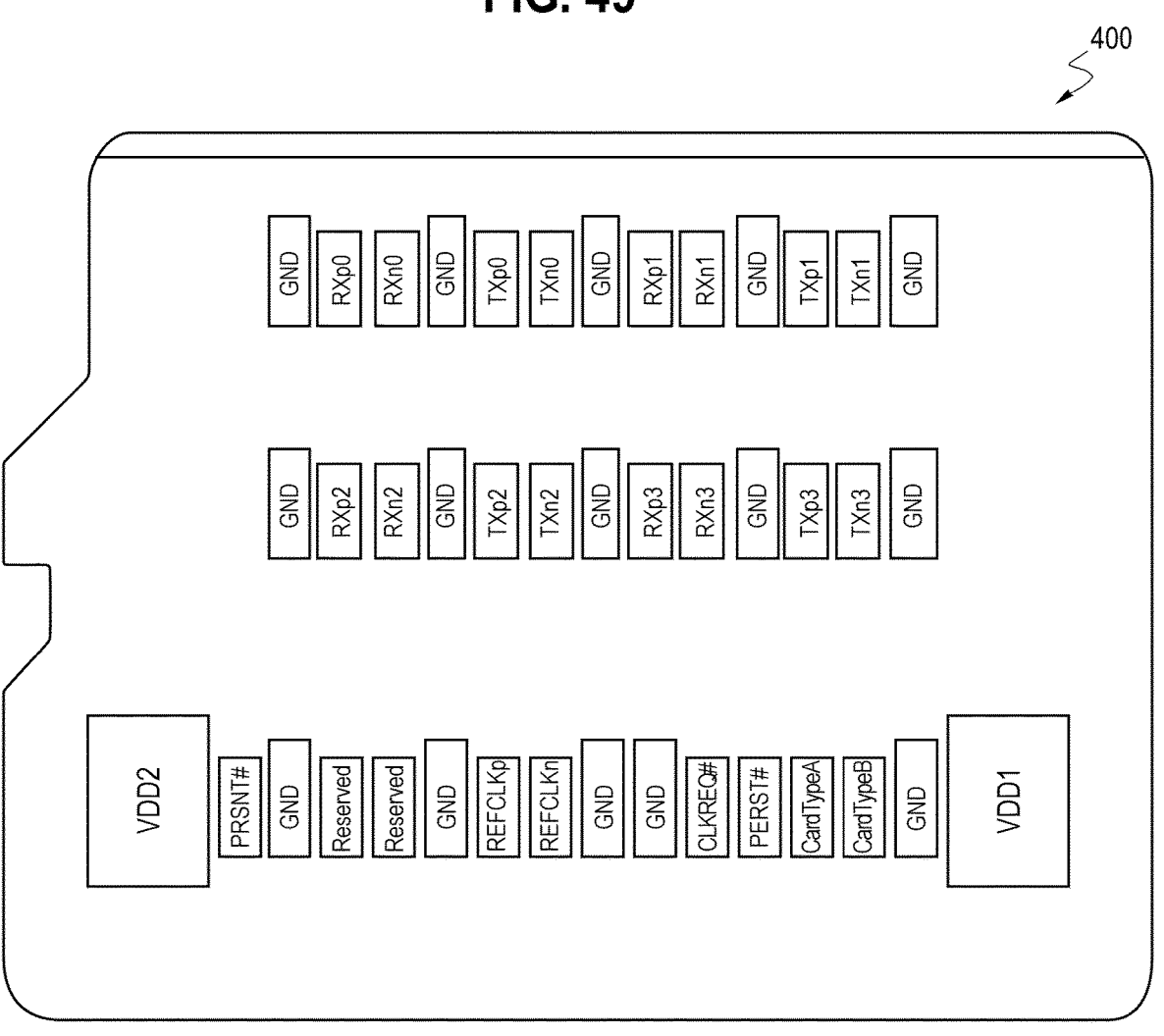
FIG. 49 is a detailed illustration of the bottom view of FIG. 47.

FIGS. 47 and 49 present an alternative pad layout of another memory card 400 of an embodiment (the other views of this memory card 400 can be the same as the memory card 300 discussed above). In this embodiment, instead of having three VDD1 pads and three VDD2 pads on either side of the back row, a single, larger VDD pad is located on either side of the back row. In one implementation, the single, larger VDD pad is about 1.5 mm×2.5 mm.

Other alternatives are possible, such as using an additional (e.g., fourth/back) row containing additional VDD pads.

There are several advantages associated with these embodiments. For example, the disclosed form factor allows a relatively-large number of pads to fit in a row, which is in contrast to memory cards that use smaller pads and/or a narrower distance between pads to increase the number of rows with fewer pads in each row. By increasing the pad width and/or the distance between the pads, these embodiments can reduce the complexity of the connector design, lower the cost of production due to decreased required accuracy, and avoid signal integrity issues that might be encountered with the other designs. Further, reducing complexity of the connector's design by reducing the number of rows can be beneficial in relatively-small memory cards and can reduce the risk of signal conflicts when doing hot insertion/removal of the memory card. Additionally, these embodiments can be beneficial for side insertion of a memory card with similar dimensions and a similar number of pads and/or four channels of PCIe using similar (or larger) pad dimensions.

Turning again to the drawings, FIGS. 50-57 are rear, bottom perspective; front, top perspective; top; left-side; right-side; front; rear; and bottom views, respectively, of a memory card 500 of another embodiment. As with the memory cards 300 in FIGS. 39-46, the memory card 500 of this embodiment has a width (i.e., the back edge in the direction of insertion) that is wider than its length.

Figure 50:
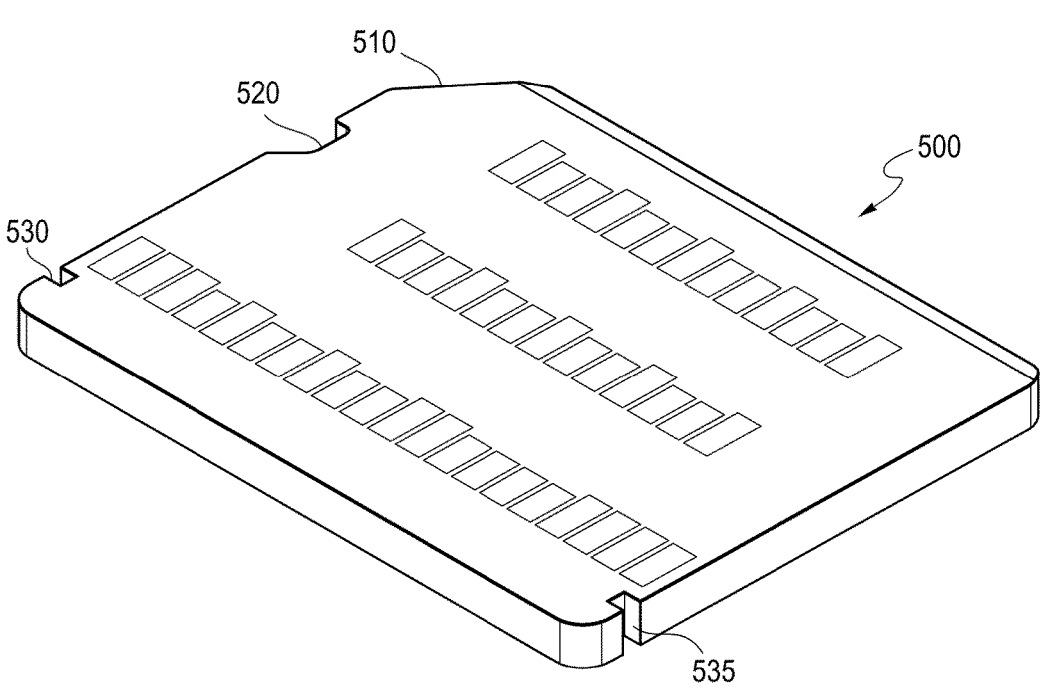
FIG. 50 is a rear, bottom perspective view of a memory card of an embodiment.
Figure 51:
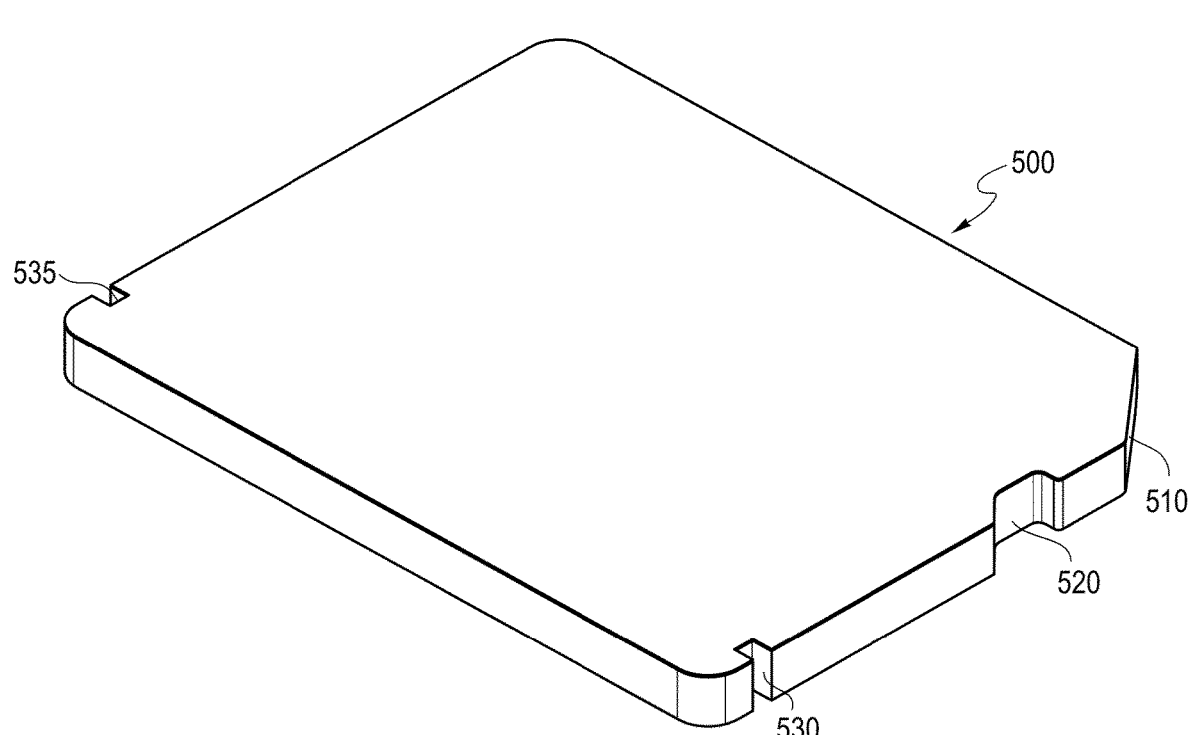
FIG. 51 is a rear, top perspective view of the memory card shown in FIG. 50.
Figures 52, 53, 54, 55, 56:
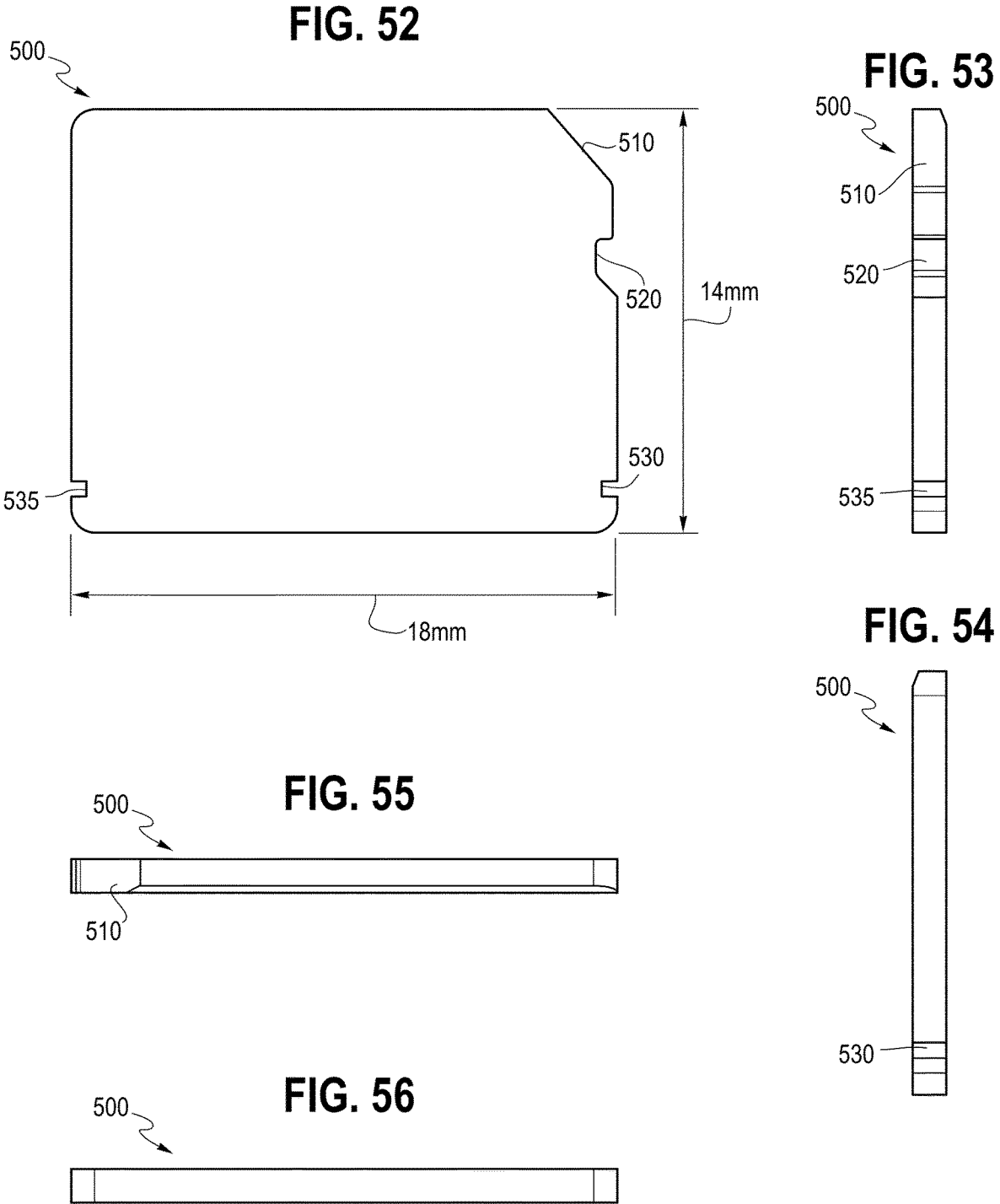
FIG. 52 is a top view of the memory card shown in FIG. 50.
FIG. 53 is a right-side view of the memory card shown in FIG. 50.
FIG. 54 is a left-side view of the memory card shown in FIG. 50.
FIG. 55 is a front view of the memory card shown in FIG. 50.
FIG. 56 is a rear view of the memory card shown in FIG. 50.
Figures 57, 58:
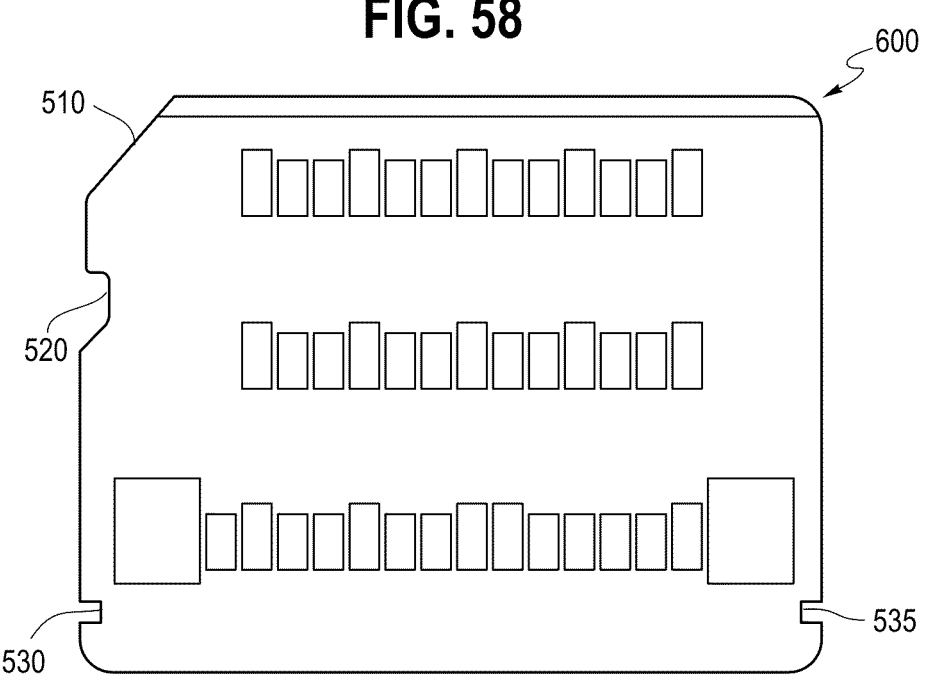
FIG. 57 is a bottom view of the memory card shown in FIG. 50.
FIG. 58 is a bottom view of a memory card of another embodiment.
Figure 59:
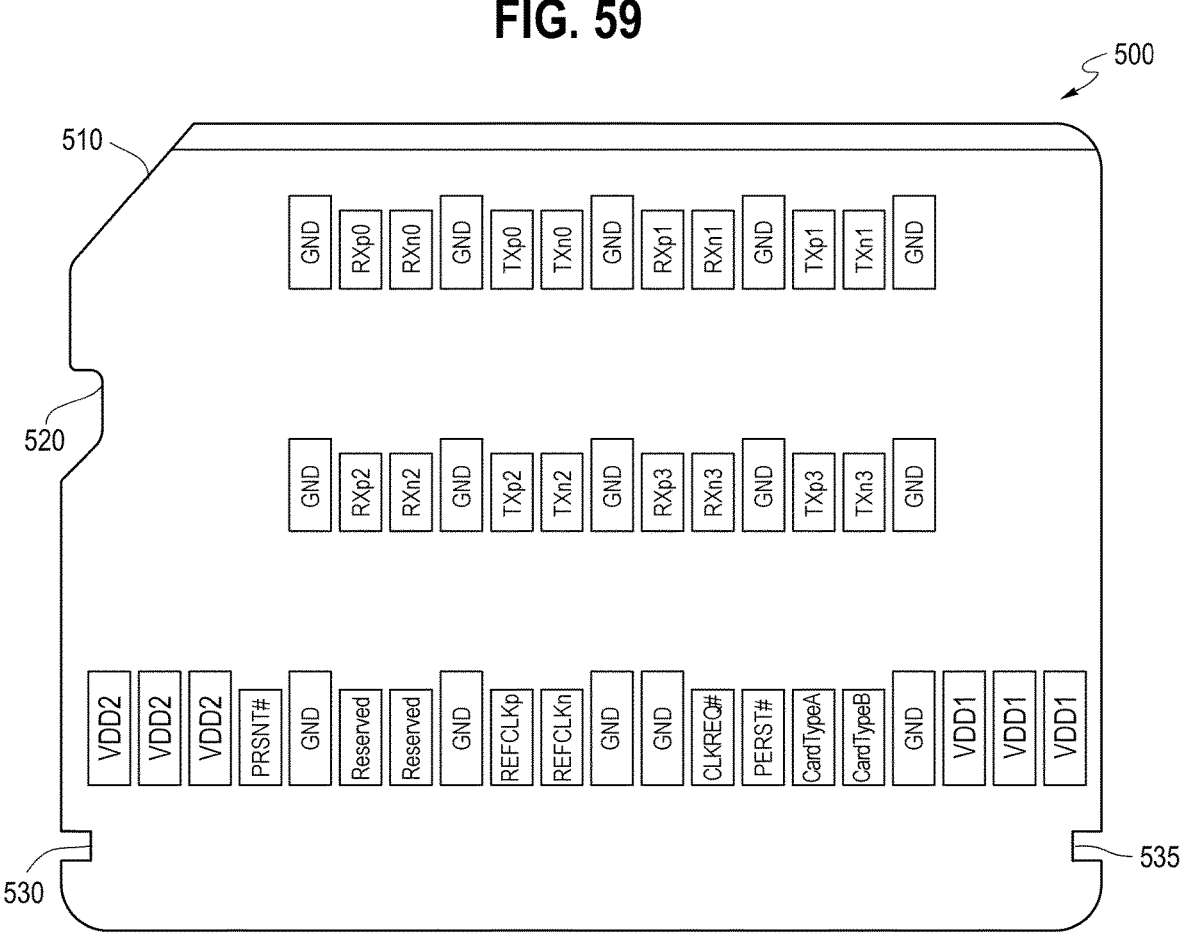
FIG. 59 is a detailed illustration of the bottom view of FIG. 57.
Figure 61:
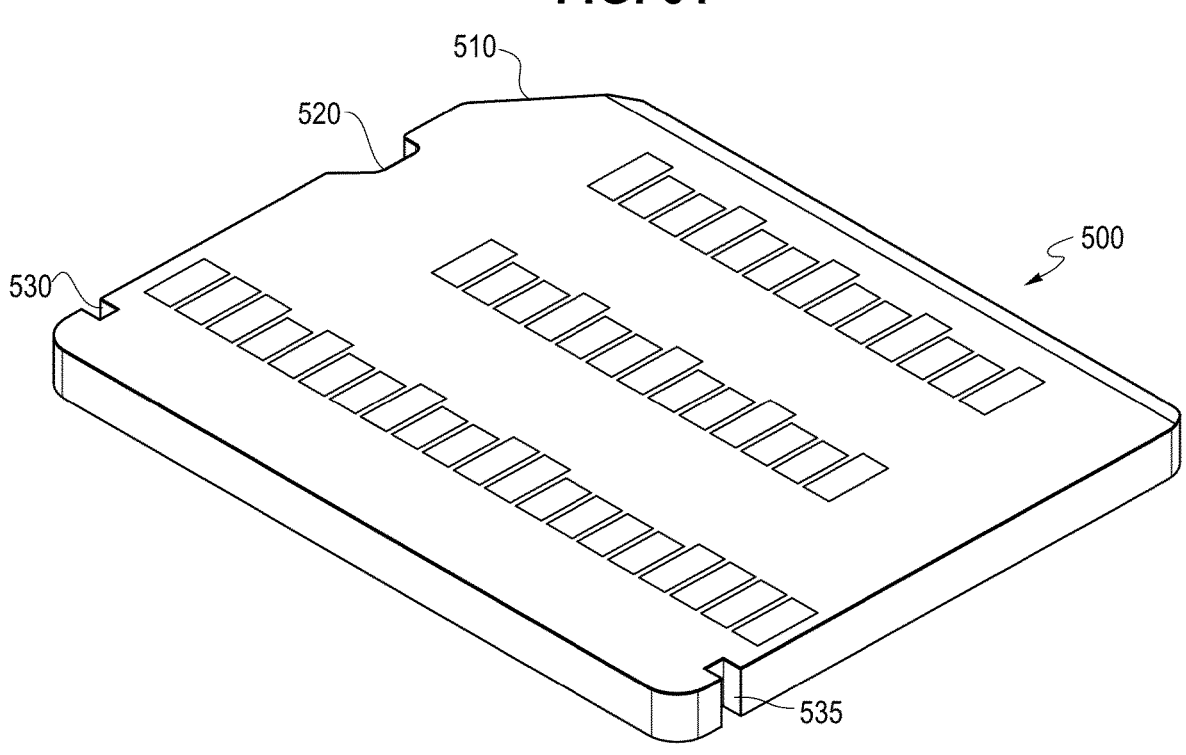
FIG. 61 is a rear, bottom perspective view of the memory card shown in FIG. 59.

There are several similarities and differences between this memory card 500 and the memory card 300 in FIGS. 39-46. Starting with the similarities first, in one example implantation (see FIG. 52), the form factor of the memory card 500 is about 14 mm×18 mm. Also, as shown in FIGS. 50 and 57, the pad layout on the bottom of the memory card 500 of this embodiment is similar to the pad layout on the bottom of the memory card 300 in FIGS. 40 and 46. In one example implementation, the length of the longer pad is about 1.6 mm or 1.65 mm, the length of the shorter pad is about 1.35 mm, the pad width is about 0.70 mm, 0.71 mm, or 0.72 mm, and the distance between the pads is about 0.15 mm. These dimensions are merely examples. FIG. 59 is a detailed illustration of the function of each of these pads in an example embodiment, and FIG. 61 is a bottom perspective view of the memory card shown in FIG. 59. As shown in FIG. 59, the power pads (the three VDD1 pads and the three VDD2 pads) are on either side of the back row, and there are no pads forward (in the direction of card insertion) of the power pads. As such, the signal pads of the memory card 500 will never touch any power pads of a host during card insertion or removal, thereby avoiding any conflicts in case of hot plug-in/out (i.e., insertion or removal of the card 500 while the host is providing power to the card).

Figure 60:
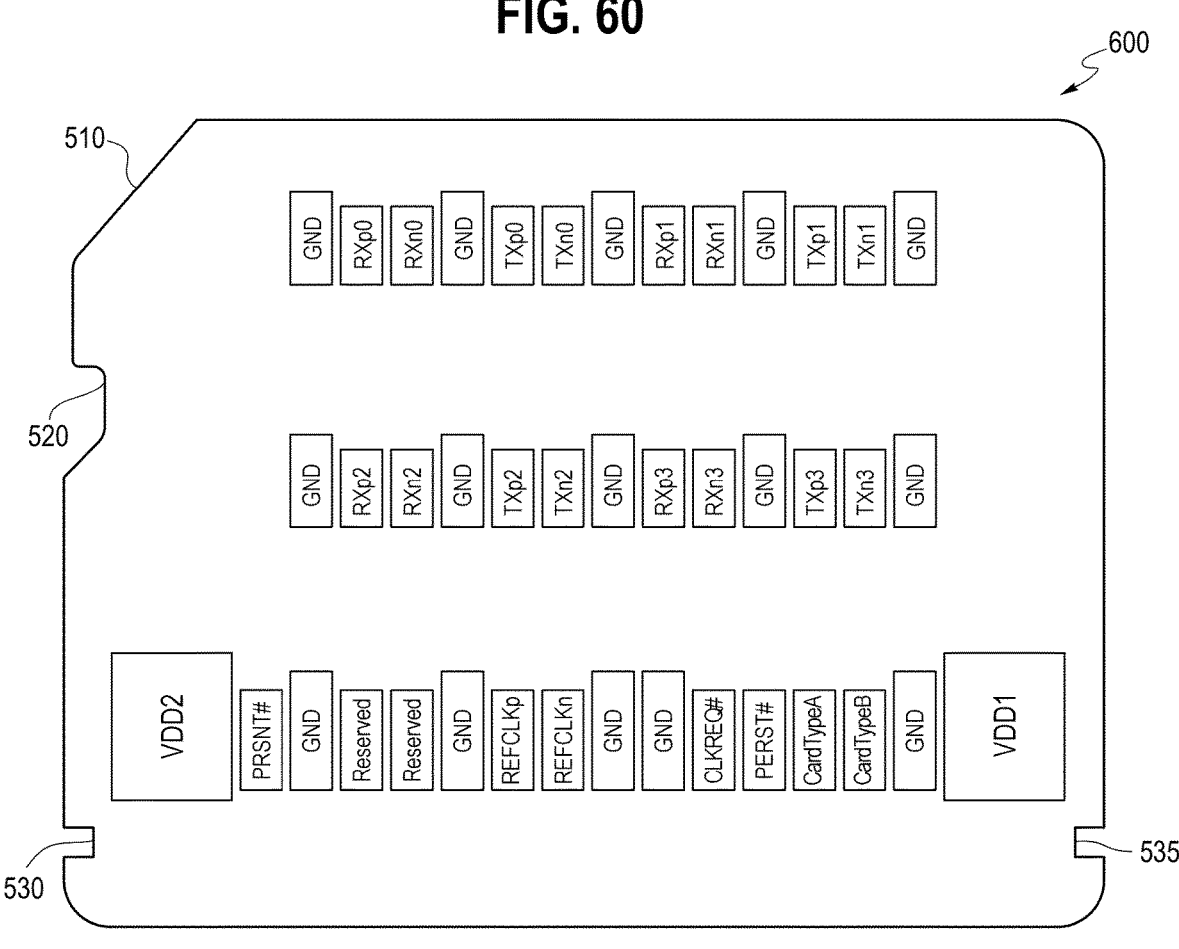
FIG. 60 is a detailed illustration of the bottom view of FIG. 58.
Figure 62:
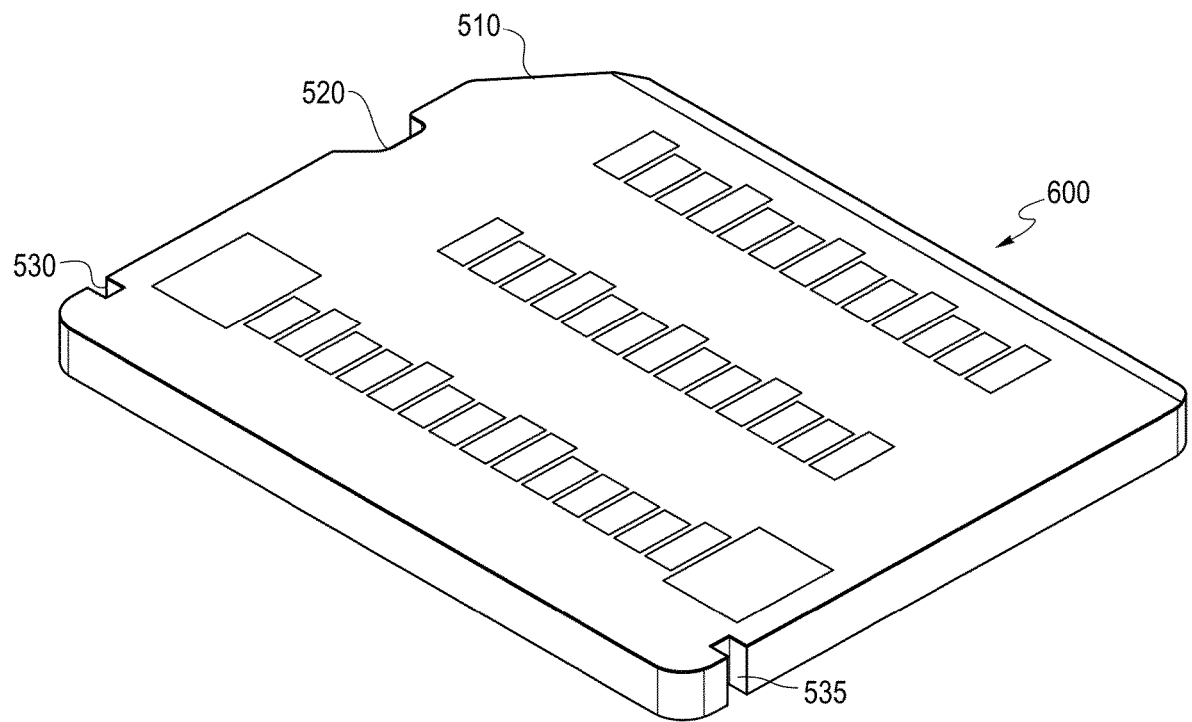
FIG. 62 is a rear, bottom perspective view of the memory card shown in FIG. 60.

FIGS. 58 and 60 present an alternative pad layout of another memory card 600 of an embodiment that is similar to the alternative pad layout of the memory card 500 shown in FIGS. 47 and 49, and FIG. 62 is a bottom perspective view of the memory card shown in FIG. 60. (The other views of this memory card 600 can be the same as the memory card 500 discussed above.) In this embodiment, instead of having three VDD1 pads and three VDD2 pads on either side of the back row, a single, larger VDD pad is located on either side of the back row. In one implementation, the single, larger VDD pad is about 1.5 mm×2.5 mm. Other alternatives are possible, such as using an additional (e.g., fourth/back) row containing additional VDD pads.

As mentioned above, there are also several differences between the memory card 500 of this embodiment and the memory cards 300 in FIGS. 30-47. For example, the memory card 500 of this embodiment does not have a raised lower lip at the back for the memory card 500, so the side dimensions of the memory card 500 are different. In one example implementation, the thickness of the memory card 500 is about 1.0+/−0.1 mm on its edge. It should be noted that other dimensions can be used, and this and other dimensions provided herein should not be read into the claims unless expressly recited therein.

As another example, the upper-right corner of the top, front side of the memory card 300 in FIGS. 39-47 has a slightly rounded corner to what would otherwise be a 90-degree edge. In contrast, the upper-right corner 510 of the top, front side of the memory card 500 in this embodiment has an angled surface, which results in a "diagonal-cut corner." In one example implementation the angled surface starts about 2 mm from the side edge of the memory card 500 and extends about 2.5 mm from the top edge of the memory card. This diagonal-cut edge 510 can be used to prevent reverse insertion of the memory card 500 into a host.

As another difference, the locking mechanism notch on the side of the memory card 300 in FIGS. 30-49 has the same shape and size as conventional microSD™ cards. In contrast the locking mechanism notch 520 on the side of the memory card 500 of this embodiment has a different shape. In one example implementation, the top of the locking mechanism notch 520 is about 4.2 mm from the top edge of the memory card 500 and extends about 0.5 mm into the side edge of the memory card 500. This locking mechanism notch 520 can be used with push-push connectors in a host to lock the memory card 500 in place and unlock the memory card 500.

As yet another difference, the two notches 530, 535 at the left and right sides of the memory card 500 near the bottom rear service, can be used to engage with a user's fingernails (or a separate tool) to assist the a user in removing the memory card 500 from a host (e.g., a card reader; a mobile phone, tablet, watch, or other mobile device; a computer, etc.).

There are several advantages associated with this embodiment. For example, this embodiment presents a memory card form factor that can be used with the mobile computing devices. In one example implementation, the memory card has minimum X-Y dimensions and a thickness that allows for a maximized internal area for components to allow a relatively-large number of pads (e.g., for up to 4 PCIe channels). This embodiment can also allow for hot removal/insertion of the memory card without conflicts and may be used in removable or semi-removable applications. Further, the memory card in this embodiment has a diagonal-cut-corner shape which can be used to prevent reverse insertion (similar to SD cards), a full card lock mechanism (similar to microSD cards) with push-push connectors, and two side notches at the far end that can be used to pull the memory card out in easy manner using. While some of these features may be present in isolation in other memory cards, some of those other memory cards have a long narrow area at the front that restricts the internal component's usage and have a thicker far end for pulling. Also, while SD cards have a diagonal-cut corner for reverse insertion protection, they do not have a shape that allows a simple full lock mechanism, nor do they have pull-out notches at the far end without any effect on the very thin dimension of the memory card. Accordingly, the combination of features in this embodiment provides for a result that is greater than the sum of its parts.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the embodiments described herein can be used alone or in combination with one another.

What is claimed is:

1. A memory card comprising:
a top surface, wherein the upper-right corner of a front of the top surface comprises a diagonal-cut corner;
a first side surface comprising a locking mechanism notch and a first card removal notch;
a second side surface comprising a second removal notch; and
a bottom surface opposite the top surface, wherein the bottom surface comprises a plurality of pads;
wherein:
a first row of pads located toward a front of the memory card comprises a plurality of pads, none of which are power pads;
a last row of pads located toward a rear of the memory card comprises at least one power pad;
the at least one power pad is positioned on the memory card such that there are no other non-power pads between the at least one power pad and the front of the memory card; and
a width of the memory card is larger than a length of the memory card, wherein the width of the memory card corresponds to a back edge of the memory card in a direction of insertion into a host.

2. The memory card of claim 1, wherein the width of the memory card is about 18 mm and the length of the memory card is about 14 mm.

3. The memory card of claim 1, wherein the width of the memory card is about 18 mm and the length of the memory card is about 16 mm.

4. The memory card of claim 1, wherein a thickness of the memory card is about 1.0+/−0.1 mm on its edge.

5. The memory card of claim 1, wherein the diagonal-cut corner starts about 2 mm from a side edge of the memory card and extends about 2.5 mm from a top edge of the memory card.

6. The memory card of claim 1, wherein a top of the locking mechanism notch is about 4.2 mm from a top edge of the memory card and extends about 0.5 mm into the first side surface of the memory card.

7. The memory card of claim 1, wherein the at least one power pad comprises one or more power pads located at a first end of the last row and one or more power pads located at a second end of the last row.

8. The memory card of claim 7, wherein:
the one or more power pads located at the first end of the last row comprise three power pads; and
the one or more power pads located at the second end of the last row comprise three power pads.

9. The memory card of claim 7, wherein:
the one or more power pads located at the first end of the last row comprise a single power pad; and
the one or more power pads located at the second end of the last row comprise a single power pad.

10. The memory card of claim 9, wherein the single power pad at the first end of the last row and/or the single power pad at the second end of the last row is larger than any other pad of the plurality of pads.

11. The memory card of claim 9 wherein the single power pad at the first end of the last row and/or the single power pad at the second end of the last row is about 1.5 mm×about 2.5 mm.

12. The memory card of claim 1, wherein the plurality of pads comprises at least one pad comprising a length of about 1.6 mm to about 1.65 mm.

13. The memory card of claim 12, wherein the plurality of pads comprises at least one additional pad comprising a length of about 1.35 mm.

14. The memory card of claim 1, wherein the plurality of pads comprises at least one pad comprising a width of about 0.70 mm to about 0.72 mm.

15. The memory card of claim 1, wherein a distance between two adjacent pads of the plurality of pads is about 0.15 mm.

16. The memory card of claim 1, wherein the locking mechanism notch comprise a different shape than a microSD™ card locking mechanism notch.

17. A memory card comprising:
a top surface, wherein the upper-right corner of a front of the top surface comprises a diagonal-cut corner;
a first side surface comprising a locking mechanism notch and a first card removal notch;
a second side surface comprising a second removal notch; and
a bottom surface opposite the top surface, wherein the bottom surface comprises a plurality of pads;
wherein:
    a first row of pads located toward a front of the memory card comprises a plurality of pads, none of which are power pads;
    a last row of pads located toward a rear of the memory card comprises at least one power pad;
    the at least one power pad is positioned on the memory card such that there are no other non-power pads between the at least one power pad and the front of the memory card;

the at least one power pad comprises one or more power pads located at a first end of the last row and one or more power pads located at a second end of the last row; and
a width of the memory card is about 18 mm and a length of the memory card is about 14 mm, wherein the width of the memory card corresponds to a back edge of the memory card in a direction of insertion into a host.

18. The memory card of claim 17, wherein:
the one or more power pads located at the first end of the last row comprise three power pads; and
the one or more power pads located at the second end of the last row comprise three power pads.

19. The memory card of claim 17, wherein:
the one or more power pads located at the first end of the last row comprise a single power pad; and
the one or more power pads located at the second end of the last row comprise a single power pad.

20. A memory card comprising:
a top surface, wherein the upper-right corner of a front of the top surface comprises a diagonal-cut corner;
a first side surface comprising a locking mechanism notch and a first card removal notch;
a second side surface comprising a second removal notch; and
a bottom surface opposite the top surface, wherein the bottom surface comprises a plurality of pads; and
means for preventing a signal pad of the plurality of pads from contacting a power pad of a host during insertion and removal of the memory card;
wherein a width of the memory card is about 18 mm and a length of the memory card is about 16 mm, wherein the width of the memory card corresponds to a back edge of the memory card in a direction of insertion into a host.

* * * * *